US012660550B2

(12) United States Patent
Divakar et al.

(10) Patent No.: US 12,660,550 B2
(45) Date of Patent: Jun. 16, 2026

(54) MULTI-ZONE SILICON NITRIDE WAFER HEATER ASSEMBLY HAVING CORROSION PROTECTIVE LAYER, AND METHODS OF MAKING AND USING THE SAME

(71) Applicant: CoorsTek, Inc., Golden, CO (US)

(72) Inventors: Ramesh Divakar, Arvada, CA (US); Matthew Simpson, Evergreen, CO (US); Alan Filer, Longmont, CO (US)

(73) Assignee: CoorsTek, Inc., Golden, CO (US)

( * ) Notice: Subject to any disclaimer, the term of this patent is extended or adjusted under 35 U.S.C. 154(b) by 1247 days.

(21) Appl. No.: 16/918,889

(22) Filed: Jul. 1, 2020

(65) Prior Publication Data

US 2021/0005480 A1    Jan. 7, 2021

Related U.S. Application Data

(60) Provisional application No. 62/908,441, filed on Sep. 30, 2019, provisional application No. 62/869,388, filed on Jul. 1, 2019.

(51) Int. Cl.
| | |
|---|---|
| *H10P 72/00* | (2026.01) |
| *C04B 35/584* | (2006.01) |
| *C04B 35/63* | (2006.01) |
| *C04B 35/634* | (2006.01) |
| *C04B 41/00* | (2006.01) |
| *C04B 41/45* | (2006.01) |
| *C04B 41/50* | (2006.01) |
(Continued)

(52) U.S. Cl.
CPC ........ *H10P 72/0432* (2026.01); *C04B 35/584* (2013.01); *C04B 35/6303* (2013.01);
(Continued)

(58) Field of Classification Search
CPC .... B32B 18/00; C04B 2235/76; C04B 35/584
See application file for complete search history.

(56) References Cited

U.S. PATENT DOCUMENTS

| | | | |
|---|---|---|---|
| 5,633,073 A | 5/1997 | Cheung et al. | |
| 6,391,812 B1 | 5/2002 | Araki et al. | |
(Continued)

FOREIGN PATENT DOCUMENTS

| | | | |
|---|---|---|---|
| JP | 11157916 A | * | 6/1999 |
| JP | H11157916 A | | 6/1999 |
| JP | 2000173749 A | * | 6/2000 |

OTHER PUBLICATIONS

Keiviite-(Yb); Keiviite-(Yb): Mineral information, data and localities; https://www.mindat.org/min-2178.html ; Sep. 8, 2023 (Year: 2023).*

(Continued)

*Primary Examiner* — Adam Krupicka
(74) *Attorney, Agent, or Firm* — Greenberg Traurig, LLP

(57) ABSTRACT

A wafer heater assembly comprises a heater substrate and a non-porous outermost layer. The heater substrate comprises silicon nitride ($Si_3N_4$) and includes at least one heating element embedded therein. The non-porous outermost layer is associated with at least a first surface of the heater substrate. The non-porous outermost layer comprises a rare-earth (RE) disilicate ($RE_2Si_2O_7$); where RE is one of Yb and Y. The non-porous outermost layer includes an exposed surface configured to contact a wafer for heating, the exposed surface opposite the first surface of the heater substrate. Methods of making wafer heater assemblies are also disclosed as well as methods of using the wafer heater assembly.

19 Claims, 16 Drawing Sheets

(51) Int. Cl.

| | | |
|---|---|---|
| *C04B 41/87* | (2006.01) | |
| *F27D 5/00* | (2006.01) | |
| *H05B 3/12* | (2006.01) | |
| *H05B 3/28* | (2006.01) | |

(52) U.S. Cl.

CPC .......... *C04B 35/634* (2013.01); *C04B 41/009* (2013.01); *C04B 41/4539* (2013.01); *C04B 41/5024* (2013.01); *C04B 41/87* (2013.01); *F27D 5/0037* (2013.01); *H05B 3/12* (2013.01); *H05B 3/283* (2013.01); *C04B 2235/3224* (2013.01); *C04B 2235/3418* (2013.01); *C04B 2235/3873* (2013.01); *C04B 2235/3891* (2013.01); *C04B 2235/6025* (2013.01); *C04B 2235/656* (2013.01); *C04B 2235/658* (2013.01); *C04B 2235/661* (2013.01); *H05B 2203/037* (2013.01)

(56) References Cited

U.S. PATENT DOCUMENTS

| | | | |
|---|---|---|---|
| 6,447,937 | B1 | 9/2002 | Murakawa et al. |
| 9,324,589 | B2 | 4/2016 | Pease et al. |

| | | | |
|---|---|---|---|
| 2001/0006172 | A1 | 7/2001 | Katsuda et al. |
| 2002/0098391 | A1 | 7/2002 | Tanaka et al. |
| 2002/0125239 | A1 | 9/2002 | Chen et al. |
| 2013/0105463 | A1 | 5/2013 | Schmidt et al. |
| 2016/0024962 | A1 | 1/2016 | Luthra |
| 2016/0108510 | A1 | 4/2016 | Kirby et al. |
| 2017/0140902 | A1* | 5/2017 | Simpson ............. C23C 16/4404 |
| 2017/0250057 | A1 | 8/2017 | Simpson et al. |

OTHER PUBLICATIONS

Translation—JP-2000173749-A; Shibata T; Shibata T; Jun. 2000 (Year: 2000).*

Translation—JP-11157916-A, Aida H, Jun. 15, 1999 (Year: 1999).*

Smeacetto et al., "Protective coatings for carbon bonded carbon fibre composites," Ceramics International, vol. 34, 2008, pp. 1297-1301.

International Search Report and Written Opinion for International (PCT) Patent Application No. PCT/US2020/040532, dated Nov. 19, 2020. 19 pages.

International Preliminary Report on Patentability for International (PCT) Patent Application No. PCT/US2020/040532, dated Jan. 13, 2022, 13 pages.

* cited by examiner

1

MULTI-ZONE SILICON NITRIDE WAFER HEATER ASSEMBLY HAVING CORROSION PROTECTIVE LAYER, AND METHODS OF MAKING AND USING THE SAME

CROSS REFERENCE TO RELATED APPLICATIONS

This application claims the benefit of priority under 35 U.S.C. § 119(e) to U.S. Provisional Patent Application 62/869,388 filed Jul. 1, 2019, and U.S. Provisional Patent Application 62/908,441 filed Sep. 30, 2019. The entirety of these applications are incorporated herein by reference.

FIELD

The present disclosure relates generally to wafer heater assemblies for the processing of components, such as semiconductors, to methods of making such assemblies, and methods of using such assemblies.

BACKGROUND

The processing of semiconductor wafers frequently involves corrosive gases such as halogens. This corrosive environment generates a need for corrosion-resistant wafer heaters. It is generally accepted that the most corrosion-resistant insulating materials for such applications are rare earth compounds, such as yttrium oxide (also known as "yttria"). Unfortunately, rare earth compounds tend to be both expensive and mechanically weak. The industry therefore tends to use coatings of rare earth compounds on less expensive insulators like aluminum oxide.

Several different coating methods have been used for coating the insulator substrates for wafer heaters. Physical vapor deposition (PVD) coatings have been used. These have the drawback that they are costly to apply for thicknesses of more than 10 µm. Thick, dense layers tend to spall due to internal stresses in the as-deposited coatings. Strain-tolerant thick PVD coatings are known to contain fissures between crystallites that create the potential for shedding particles. Chemical vapor deposition (CVD) for coating application has been used, but it suffers similar drawbacks. High rate deposition tends to produce fissures between grains. Denser coatings made by CVD are characterized by a grain size that tends to be small, typically less than 100 nm. Aerosol deposition has been used and also suffers from cost limitations and an inability to make thick coatings that do not spall. Thermal plasma spray is the most widely used coating technology in the semiconductor equipment industry, but it cannot produce rare-earth coatings with porosity less than 1%, and therefore is prone to the shedding of particles. Furthermore, plasma spray coatings commonly contain a high density of microcracks (typically more than 100/mm$^2$), and this, together with the porosity, leads to the shedding of particles.

Use temperatures for the heaters may range from 250° C. to 650° C. depending on the deposition chemistry being utilized. The conventional substrate material is aluminum nitride (AlN), in which a heating element, and optionally, a radio frequency (RF) electrode may be embedded. While aluminum nitride has good thermal conductivity and corrosion resistance to halogen plasmas used in cleaning at low temperatures, there are significant limitations. The corrosion resistance of AlN is poor at elevated temperatures thus resulting in formation of particulates of the corrosion product that can cause defects on the wafer. To minimize this problem, the heater is usually cooled to a lower temperature prior to the cleaning operation using halogen plasma and to prevent breakage of the heater, the cool-down process is slow. This results in an unacceptable loss of productivity in the chamber (i.e., low wafer throughput).

There is a need in the semiconductor equipment industry for high temperature corrosion-resistant wafer heaters.

BRIEF SUMMARY

These and other needs are addressed by the various aspects, embodiments, and configurations of the present disclosure.

According to one example ("Example 1"), a wafer heater assembly includes a heater substrate comprising silicon nitride (Si$_3$N$_4$). The heater substrate includes at least one heating element embedded therein. The heater substrate has a first surface, and a non-porous outermost layer associated with the first surface of the heater substrate. The non-porous outermost layer includes a rare-earth (RE) disilicate (RE$_2$Si$_2$O$_7$), wherein RE is one of Yb and Y. The non-porous outermost layer has an exposed surface opposite the first surface, the exposed surface is configured to contact a wafer for heating.

According to another example ("Example 2) further to Example 1, the rare-earth disilicate of the non-porous outermost layer comprises ytterbium disilicate (Yb$_2$Si$_2$O$_7$).

According to another example ("Example 3") further to Examples 1 or 2, the non-porous outermost layer includes at least about 95 volume percent ytterbium disilicate having a Keiviite crystal structure.

According to another example ("Example 4") further to any one of preceding Examples 1 to 3, the ytterbium disilicate non-porous outermost layer and the silicon nitride heater substrate further include an interface therebetween, and the interface is characterized as having at most about 5 volume percent porosity.

According to another example ("Example 5") further to any one of preceding Examples 1 to 4, the interface is characterized as having at most about 3 volume percent porosity.

According to another example ("Example 6") further to any one of preceding Examples 1 to 5, the interface is characterized as having at most about 1 volume percent porosity.

According to another example ("Example 7") further to any one of preceding Examples 1 to 5, the non-porous outermost layer comprising ytterbium disilicate.

According to one example ("Example 8"), a wafer heater assembly includes a heater substrate comprising silicon nitride (Si$_3$N$_4$) including at least one heating element embedded therein, the heater substrate having a first surface; and a non-porous outermost layer associated with the heater substrate at the first surface, the non-porous outermost layer comprising ytterbium disilicate (Yb$_2$Si$_2$O$_7$) and having an exposed surface opposite the first surface, the exposed surface configured to contact a wafer for heating.

According to another example ("Example 9") further to Example 8, the non-porous outermost layer includes at least about 95 volume percent ytterbium disilicate (Yb$_2$Si$_2$O$_7$) having a Keiviite crystal structure.

According to another example ("Example 10") further to Examples 8 or 9, the heater substrate includes at least about 10 volume percent beta silicon nitride (β-Si$_3$N$_4$).

According to another example ("Example 11") further to any one of preceding Examples 8 to 10, the heater substrate includes at least about 50 volume percent beta silicon nitride ($\beta$-$Si_3N_4$).

According to another example ("Example 12") further to any one of preceding Examples 8 to 11, the heater substrate includes at least about 90 volume percent beta silicon nitride ($\beta$-$Si_3N_4$).

According to another example ("Example 13") further to any one of preceding Examples 8 to 12, further including a supporting disk configured to support the heater substrate.

According to another example ("Example 14") further to any one of preceding Examples 8 to 13, the at least one heating element embedded in the heater substrate includes a first heating element and a second heating element, the first heating element associated with a first heating zone and the second heating element associated with a second heating zone.

According to another example ("Example 15") further to any one of preceding Examples 8 to 14, further including a third heating element associated with a third heating zone.

According to another example ("Example 16") further to any one of preceding Examples 8 to 15, the outermost layer average grain size is from about 0.1 $\mu$m to about 100 $\mu$m.

According to another example ("Example 17") further to any one of preceding Examples 8 to 16, the heater substrate average grain size is from about 0.05 $\mu$m to about 1 $\mu$m.

According to another example ("Example 18") further to any one of preceding Examples 8 to 17, the outermost layer thickness is from about 0.5 mm to about 10 mm.

According to another example ("Example 19") further to any one of preceding Examples 8 to 18, the outermost layer thickness is from about 1 mm to about 5 mm.

According to another example ("Example 20") further to any one of preceding Examples 8 to 19, the heater substrate thickness is at least 5 mm.

An aspect of the invention is a wafer heater assembly. The assembly includes a heater substrate comprising silicon nitride ($Si_3N_4$), and at least one heating element embedded therein. The heater substrate has a first surface, and a non-porous outermost layer associated with the first surface of the heater substrate. The non-porous outermost layer includes a rare-earth (RE) disilicate ($RE_2Si_2O_7$), where the RE is one of Yb and Y. The non-porous outermost layer has an exposed surface opposite the first surface that is configured to contact a wafer for heating.

An aspect of the invention is a wafer heater assembly that includes a heater substrate comprising nitride and at least one heating element embedded therein. The heater substrate has a first surface and a non-porous outermost layer associated with the heater substrate at the first surface. The non-porous outermost layer includes ytterbium disilicate ($Yb_2Si_2O_7$) and has an exposed surface opposite the first surface configured to contact a wafer for heating.

An aspect of the invention is a method of forming a wafer heater assembly. The method includes preparing a first layer material comprising at least one additive and a nitride selected from the group consisting of silicon nitride, an aluminum nitride, and combinations thereof. The heating element(s) is applied to the first layer material using a method selected from the group consisting of dry pressing, cold isostatic pressing, roll compaction, or tape casting followed by lamination, and combinations thereof, to form a pre-laminate. The pre-laminate is then sintered at a temperature of between about 1500° C. and about 1900° C. to form the wafer heater assembly.

DETAILED DESCRIPTION

Introduction

Figure 1:
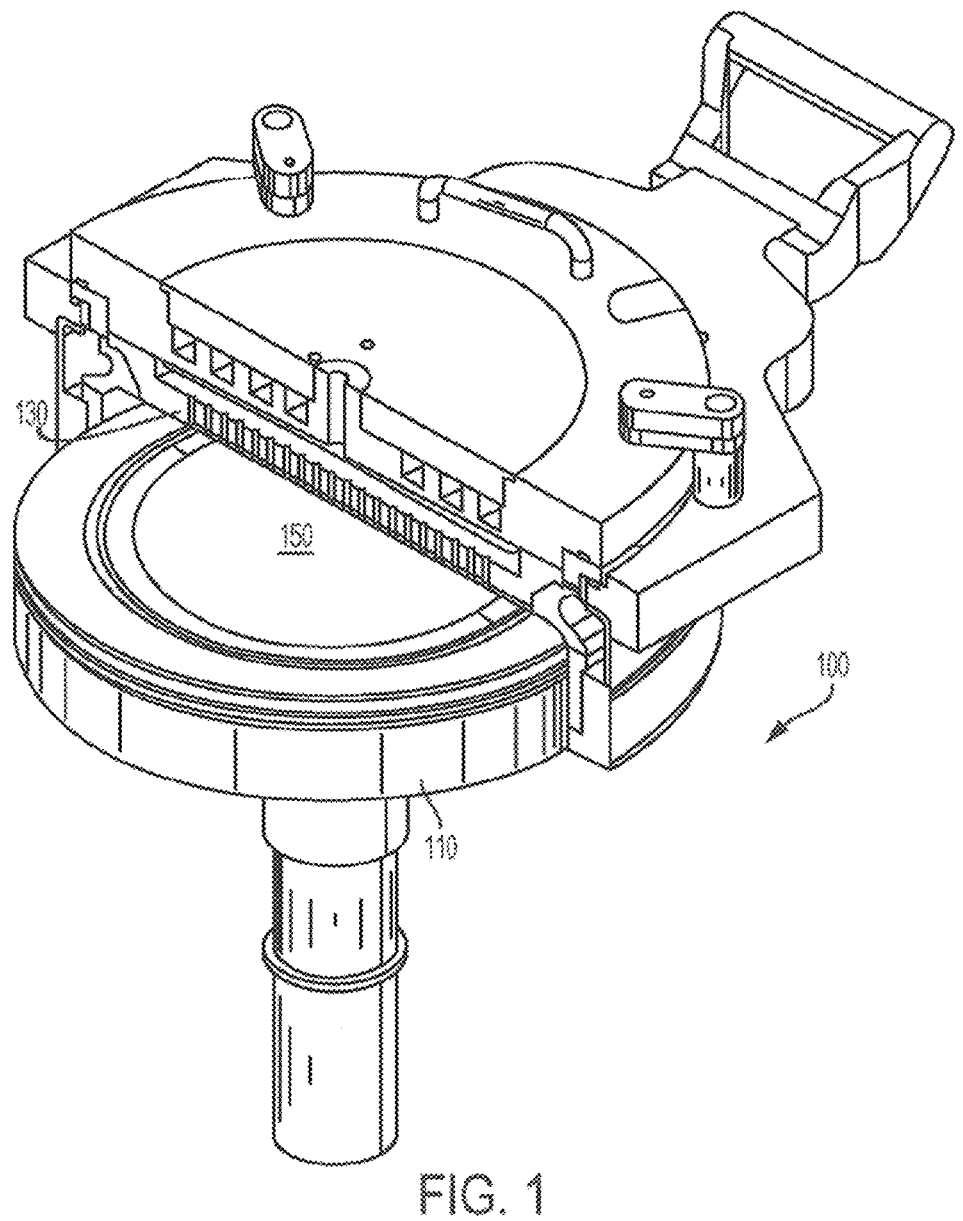
FIG. 1 illustrates a perspective view of a chemical vapor deposition reactor assembly including a wafer heater assembly.

A ceramic substrate and a corrosion protective layer comprising a rare earth silicate are co-sintered to form a dense wafer heater having at least one heating element embedded therein. This solves the problem of coatings (via plasma spray coating operation, for example) being applied to previously sintered substrates, wherein the coating subsequently suffers from problems such as spalling or shedding particles during use. In an embodiment of the invention, the corrosion protective layer includes a rare earth silicate non-porous outermost layer on a suitable substrate material to provide a corrosion-resistant wafer heater. The rare earth silicate of the non-porous outermost layer is chosen from ytterbium disilicate ($Yb_2Si_2O_7$) and yttrium disilicate ($Y_2Si_2O_7$) and the heater substrate is a ceramic, such as a nitride chosen from silicon nitride and aluminum nitride. The heater substrate has at least one heating element embedded therein. Components, assemblies, and methods of the present disclosure provide a way to meet the need for physically and chemically stable, corrosion protective layers for wafer heaters that are integral to the plasma reactors used in the semiconductor industry.

Throughout this Specification, the nitride of the invention is described as silicon nitride. One skilled in the art would understand that aluminum nitride can be used in addition or in place of the silicon nitride without deviating from the invention.

Further, embodiments or variations to the invention are described throughout the Specification. One skilled in the art understands that various embodiments can be used with the invention, either individually or when combined with other embodiments.

Definitions

As used herein, various terms are defined as follows. "Alumina" is commonly understood to be aluminum oxide, substantially comprising $Al_2O_3$. "Yttria" is commonly understood to be yttrium oxide, substantially comprising $Y_2O_3$. "Ytterbia" is commonly understood to be ytterbium oxide, substantially comprising $Yb_2O_3$. The term "substantially" generally refers a purity of about 90 wt %, preferably about 91 wt % or about 92 wt % or about 93 wt % or about 94 wt % or about 95 wt % or about 96 wt % or about 97 wt % or about 98 wt % or about 99 wt % or about 100 wt %. The term "about" generally refers to plus or minus 10% of the indicated number. For example, "about 10%" may indicate a range of 9% to 11%, and "about 20" may mean from 18% to 22%. Other meanings of "about" may be apparent from the context, such as rounding off, so, for example "about 1" may also mean from 0.5 to 1.4. The term "soak" refers to the holding time at a particular temperature or pressure in a hot pressing cycle.

Other definitions include the following. "Adhesion strength" is measured by the ASTM C633 method. "Loss tangent" is the ratio of the imaginary part of the dielectric constant to the real part, and is directly proportional to the power absorbed by the component. "Porosity" is measured by image analysis of a polished section, polished according to the following scheme (polishing supplies provided by Struers, Inc.): (i) 60 μm diamond: as needed to flatten the surface; (ii) 15 μm diamond, fixed abrasive pad: about 2 min; (iii) 9 μm diamond, Largo (plastic) pad: about 8 min; (iv) 3 μm diamond, DAC (nylon) pad: about 6 min; and, (v) 1 μm diamond, napped cloth: about 3 min. "Grain size" is measured by the by ASTM-E112 method. "Green" or "unsintered" ceramics as referred to herein include ceramic materials or powders which have not been densified via a high temperature thermal process. "Sintered" or "Co-sintered" refers to one or more ceramic materials that have been exposed to a high temperature thermal process to promote sintering. "Sintering" is a thermal or heat treatment process to promote material transport and densification through the gradual elimination of porosity. The sintering process is used to produce materials with controlled microstructure and porosity. "Coating" is a layer applied to a substrate, for example, a sintered substrate. "Laminate" or "composite laminate" is an assembly of layers that are joined via a process such as sintering, for example. "Component" is a part or product.

Ceramics are inorganic, non-metallic materials known for their ability to withstand high temperatures. Ceramics include oxides, non-oxides, and composites (combinations of oxides and non-oxides). Oxides include, in non-limiting examples, alumina, glass-ceramics, beryllia, mullite, ceria, and zirconia. Non-oxides include carbides, borides, nitrides, and silicides. Ceramic oxides, non-oxides, and composites are useful as substrates for wafer heaters according to the present disclosure.

A reactor for semiconductor fabrication or semiconductor processing is useful for etching, deposition or both. A reactor is referred to interchangeably herein as a semiconductor processing reactor, a semiconductor fabrication reactor, or simply as a reactor. Reactors are useful for plasma etching, deposition or both. In some embodiments, a wafer heater assembly includes a heater substrate and a corrosion-resistant non-porous outermost layer that is resistant to a plasma etching treatment employed in semiconductor processing. Reactors used for deposition periodically run an etching process for cleaning of the reactor. In some embodiments, the reactor is a deposition reactor configured for in-situ cleaning with halogen gases, such as fluorine-based plasmas, and the corrosion-resistant component is a wafer heater. Wafer Heater Assemblies.

FIG. 1 illustrates a cross-sectional schematic view of CVD reactor assembly 100 including wafer heater 110. Reactor assembly 100 is configured for use in fabricating semiconductor chips and for in-situ cleaning with halogen gases (commonly atomic fluorine, but other halogen gases can be used). CVD reactor assembly 100 includes wafer heater 110 and showerhead 130. Reactive gases flow through showerhead 130 onto wafer 150, where a deposit is formed. The temperature of the wafer during manufacturing is maintained and kept uniform by wafer heater 110, which may also have a corrosion protective layer according to some embodiments to protect the heater during cleaning. Wafer heater 110 may further include interposing or embedded layers, such as an electrode, within to assist the generation of a plasma to promote chemical reactions.

An aspect of the disclosure is directed to a high temperature corrosion-resistant wafer heater including a non-oxide heater substrate. The non-oxide heater substrate is a nitride, such as $Si_3N_4$ or AlN. In the construction of a silicon nitride heater, for example, a plurality of heating elements, interconnects, leads, electrodes, and the like are either embedded in the silicon nitride heater substrate and/or are disposed on the surface of the silicon nitride heater substrate body. An aspect of the disclosure is also directed to a non-porous outermost layer at least covering the heater substrate material on the side that contacts the wafer to provide a corrosion protective layer on top of, over, or substantially encapsulating the heater substrate.

Figure 2:
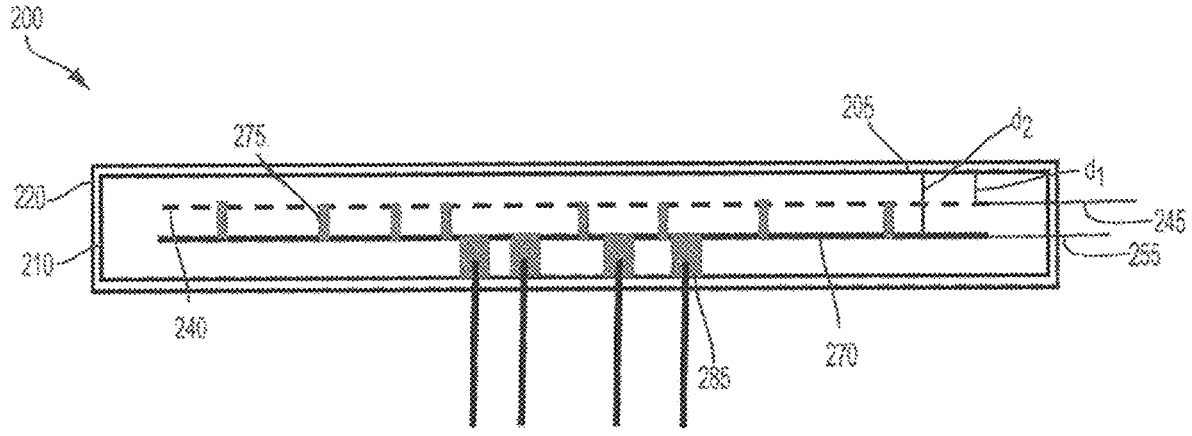
FIG. 2 schematically illustrates a cross-sectional view of a wafer heater assembly.

FIG. 2 illustrates a cross-sectional schematic view of a wafer heater assembly 200 including a heater substrate 210 and a non-porous outermost layer 220. Heater substrate 210 includes a plurality of heating elements 240 configured in a first plane 245 at or near the top surface 205 of the heater substrate 210. In some embodiments, the first plane 245 is parallel to the top surface 205 and is spaced from top surface 205 at a first distance $d_1$ relative to the top surface 205. Distance di is optimized to provide the maximum temperature uniformity on the wafer surface. Factors affecting temperature uniformity may depend on boundary conditions, heating element design, the heater substrate material, and the density of heating elements within the heater substrate. For heater substrates 210 including up to ten (10) heating elements 240, for example, and having a high thermal conductivity substrate material ($\eta > 60$ W/mK), $d_1$ is chosen to be between about 0.25 cm and about 5 cm, in some embodiments about 0.25 cm, about 0.5 cm, about 0.75 cm, about 1 cm, about 1.5 cm, about 2 cm, about 2.5 cm, about 3 cm, about 3.5 cm, about 4 cm, about 4.5 cm, or about 5 cm, or at a range within any of two values set forth herein. For heater substrates 210 including greater than 80 heating elements 240, in another example, di is from about 10 μm to about 1000 μm, in some embodiments about 10 μm, about 20 μm, about 30 μm, about 40 μm, about 50 μm, about 60 μm, about 70 μm, about 80 μm, about 90 μm, about 100 μm, about 150 μm, about 200 μm, about 250 μm, about 300 μm, about 350 μm, about 400 μm, about 450 μm, about 500 μm, about 550 μm, about 600 μm, about 650 μm, about 700 μm, about 750 μm, about 800 μm, about 850 μm, about 900 μm, about 950 μm, or about 100 μm, or at a range within any of two values set forth herein. Heating elements 240 are typically made from a refractory metal, metals resistant to heat and wear. Suitable refractory metals include, but are not limited to, molybdenum, niobium, rhenium, tantalum, tungsten, and alloys thereof. Also disposed in plane 245 may optionally be additional conductive traces (not shown) joining the heating elements within the same plane. Configured in a second plane 255, parallel to the first plane 245 and positioned at a distance $d_2$ spaced from the top surface 205, is an interconnect layer 270, which serves to distribute power to the heating elements 240. Distance $d_2$ can be between about 0.05 cm and about 1 cm, in some embodiments about 0.05 cm, about 0.1 cm, about 0.2 cm, about 0.3 cm, about 0.4 cm, about 0.5 cm, about 0.6 cm, about 0.7 cm, about 0.8 cm, about 0.9 cm, about 1.0 cm, or within any range defined between any two of the foregoing values. The interconnect layer 270 may be made from a more conductive material than the heater elements 240, because dissipating heat at distance $d_2$ from the top surface may not be necessary. In some embodiments, a material for the interconnect layer can be electrically conductive, chemically compatible with the substrate material, and have a CTE that is within about $4 \times 10^{-6}$/K of the CTE of the substrate material. Suitable materials for the interconnect layer can include molybdenum, tungsten, tungsten carbide and tantalum nitride.

A plurality of conductive elements, vias 275, join the heating elements 240 of plane 245 and the interconnect layer 270 of plane 255 together. Vias 275 have a geometry configured to connect offset planes. In some embodiments, vias 275 may be cylindrical in shape (for ease of manufacture) and have diameters (or width if rectangular) from about 0.5 mm to about 1.0 mm, in some embodiments about 0.5 mm, about 0.6 mm, about 0.7 mm, about 0.8 mm, about 0.9 mm, or about 1 mm, or within any range defined between any two of the foregoing value. Because the vias 275 may be unreliable, redundancy may be employed wherein multiple vias are used for joining the same conductors. Vias 275 are conductive, in some embodiments having the same requirements as the interconnect layer materials and can be the same material as the interconnect layer material. In some embodiments, the vias 275 may have a composition different from that of the heater traces and the interconnect traces, which are also conductive, in the interconnect layer 270. Electricity to the assembly 200 is conveyed through the electrical leads 285. The assembly of FIG. 2 illustrates one layer of heating elements as shown disposed in plane 245. In other embodiments, two or more parallel layers of heating elements may be employed as described in U.S. Published Patent Application Serial No. 2013/0105463, incorporated herein by reference. In other embodiments, the interconnect layer may be omitted and thus direct connection to the external controller from the heating element layer may be employed as in U.S. Pat. No. 5,633,073, also incorporated herein by reference.

Figure 3:
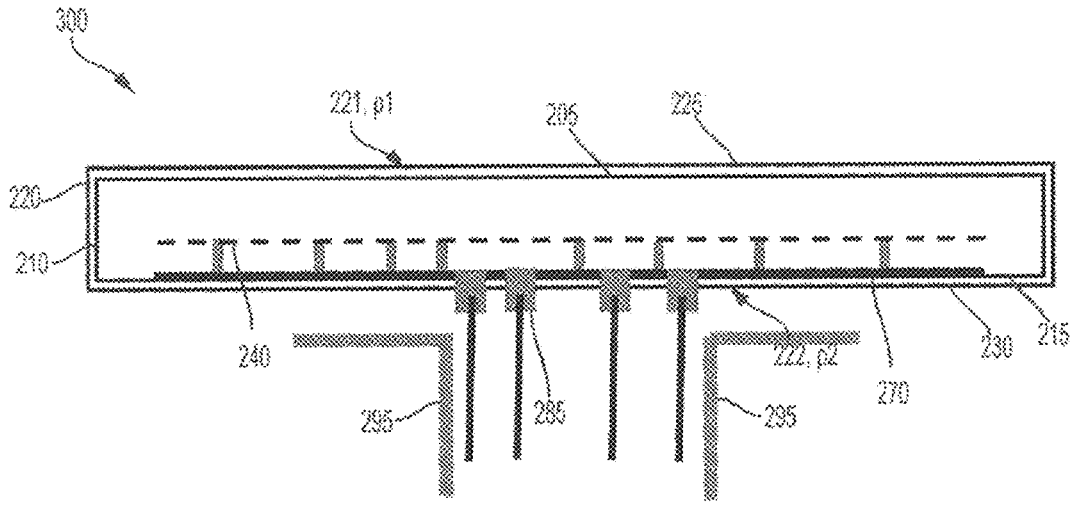
FIG. 3 schematically illustrates a cross-sectional view of a wafer heater assembly having a shroud.

Wafer heater assemblies according to the present disclosure include various configurations. As illustrated in FIG. 2, the non-porous outermost layer 220 may extend all the way around the top, sides, and bottom of the wafer heater substrate 210, thereby fully encapsulating the heater substrate 210 and also the electrical leads 285. In other embodiments, the wafer heater assembly 300 as illustrated in FIG. 3 includes the outermost layer 220 extending around the substrate 210 but does not fully encapsulate the electrical leads 285. Instead, a shroud 295 is positioned to protect the external leads 285. Shroud 295 may be bonded to the bottom surface 215 of the substrate 210, opposite surface 205, or shroud 295 may be bonded to the bottom surface 230 of the outermost layer 220, opposite surface 225. Shroud 295 may typically be exposed to lower temperatures than the wafer, for example, so as not to require outermost layer 220 to cover the shroud, and shroud 295 may be made of corrosion resistant materials, such as alumina or even coated stainless steel or anodized aluminum, that have adequate corrosion resistance while being less expensive to manufacture. In some embodiments, the non-porous outermost layer 220 may be inhomogeneous in terms of density, porosity, and/or thickness. For example, portion 221 of outermost layer 220, adjacent to the top surface 225 of outermost layer 220 where the wafer is to be positioned and where the risk of particle transfer is high during processing, has a first porosity, $\rho_1$ less than 1%, in some embodiments between about 0% and about 1%, about 0%, about 0.1%, about 0.2%, about 0.3%, about 0.4%, about 0.5%, about 0.6%, about 0.7%, about 0.8%, about 0.9%, about 1.0%, or within any range defined by two of the foregoing valued. Portion 222 of outermost layer 220, opposite portion 221 and adjacent to the bottom surface 230, has a second porosity, $\rho_2$. In some embodiments, $\rho_2$ can be greater than $\rho_1$, or $\rho_2$ can be equal to $\rho_1$. In some embodiments, the porosity of $\rho_2$ can be between about 0 and about 10%, in some embodiments between about 1-10%. In some embodiments, $\rho_2$ can be about 0.1%, about 0.2%, about 0.3%, about 0.4%, about 0.5%, about 0.6%, about 0.7%, about 0.8%, about 0.9%, about 1.0%, about 1.1%, about 1.2%, about 1.5%, about 2%, about 2.5%, about 3%, about 3.5%, about 4%, about 4.5%, about 5%, about 5.5%, about 6%, about 6.5%, about 7%, about 7.5%, about 8%, about 8.5%, about 9%, about 9.5%, or about 10%. In portion(s) of outermost layer 220 having a porosity greater than $\rho_1$, i.e., portion 222, the coating may be made by conventional processes such as plasma spray techniques, which may be acceptable and be less expensive to make.

Figure 4A:
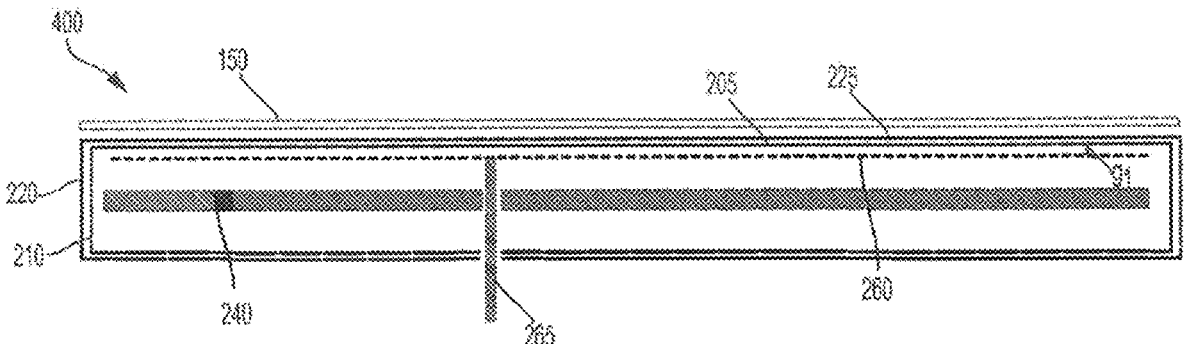
FIG. 4A schematically illustrates a cross-sectional view of a wafer heater assembly having an RF electrode and power lead.

In some embodiments, the application of radio frequency (RF) power may be necessary to generate a plasma above the wafer (i.e., wafer 150 as illustrated in FIG. 1) during processing. Wafer heater assemblies according to the present disclosure may additionally or alternatively include a conductive electrode in the wafer heater, usually embedded within the wafer heater and/or disposed near the top surface of the wafer heater assembly. Wafer heater assembly 400 for processing the wafer 150 as illustrated in FIG. 4A illustrates schematically the inclusion of an RF electrode 260 and a power lead 265. As illustrated in FIG. 4A, RF electrode 260 is embedded in heater substrate 210 near top surface 205 and includes a gap $g_1$ between the RF electrode and the non-porous outermost layer 220. Gap $g_1$ may be absent if the metal of the RF electrode 260 is chemically compatible (i.e., no adverse chemical reactions occur during the formation or service) with the outermost layer 220. In some embodiments, a buffer layer (not shown) may be disposed between the RF electrode 260 and the outermost layer 220 if there is a compatibility issue. When gap $g_1$ is present, gap $g_1$ can be between about 2 microns and about 20000 microns, in some embodiments about 2 microns, about 5 microns, about 10 microns, about 20 microns, about 30 microns, about 40 microns, about 50 microns, about 60 microns, about 70 microns, about 80 microns, about 90 microns, about 100 microns, about 200 microns, about 300 microns, about 400 microns, about 500 microns, about 600 microns, about 700 microns, about 800 microns, about 900 microns, about 1000 microns, about 1100 microns, about 1200 microns, about 1300 microns, about 1400 microns, about 1500 microns, about 1600 microns, about 1700 microns, about 1800 microns, about 1900 microns, or about 2000 microns, or within any range defined between any two of the foregoing values.

Figure 4B:
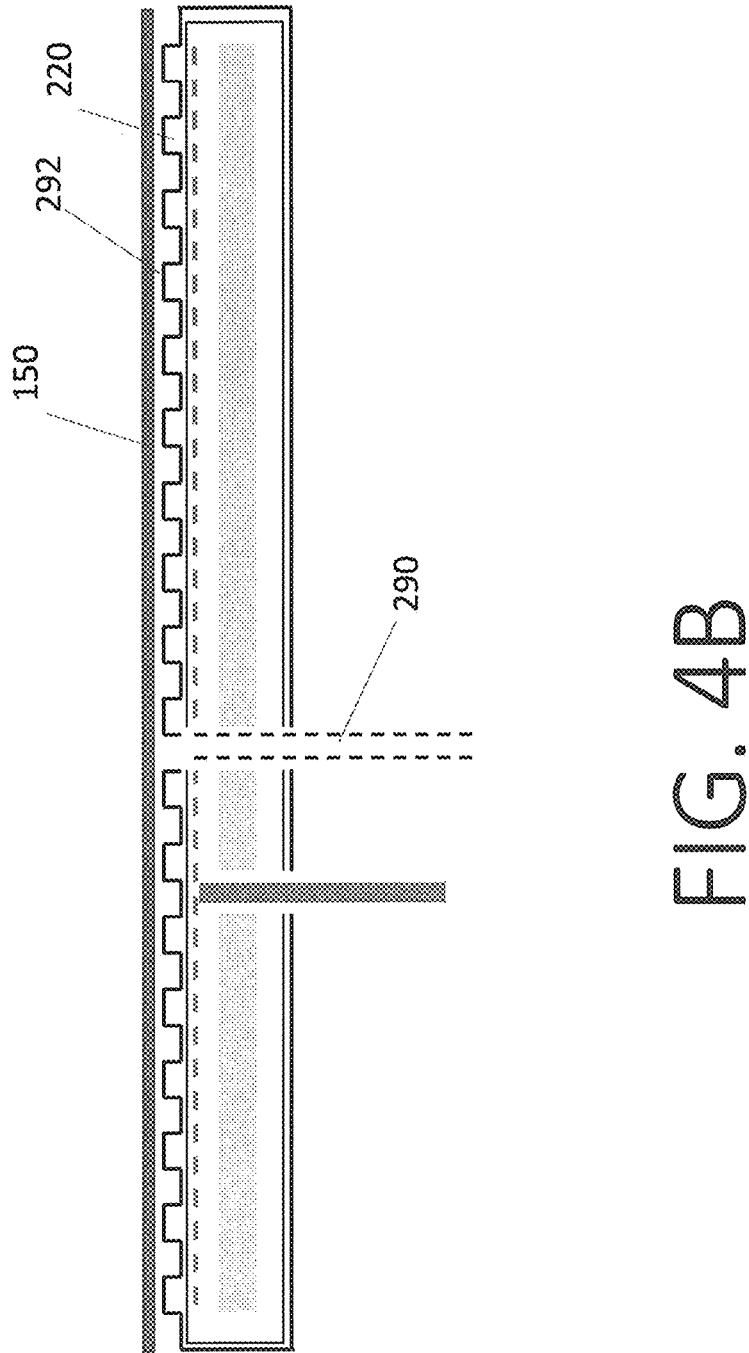
FIG. 4B schematically illustrates a cross-sectional view of a wafer heater assembly having channels in the top surface of the non-porous outermost layer and a tube for the flow of gases.

Wafer heater assemblies according to the present disclosure may additionally or alternatively include gas channels in the wafer heater assembly, the wafer heater configured to feed gas behind the wafer to prevent process gases depositing on or etching the back side of the wafer. As illustrated in FIG. 4B, channels, mesas, or grooves 292 may be machined into the top surface of the non-porous outermost layer 220 of the corrosion barrier to permit the flow of gases introduced through tube 290. The depth of the channels 292 may be from about 0.03 mm to about 5 mm into the total thickness of the outermost layer 220, in some embodiments between about 0.5 mm to about 2 mm. In some embodiments, the depth of the channels in the outermost layer can be about 0.03 mm, about 0.05 mm, about 0.1 mm, about 0.5 mm, about 1 mm, about 1.5 mm, about 2 mm, about 2.5 mm, about 3 mm, about 3.5 mm, about 4 mm, about 4.5 mm, or about 5 mm, or within any range defined between any two of the foregoing values. The tube 290 can be formed as part of the structure of the wafer heater, or it could be a separate item joined to the wafer heater assembly. In this second case, choice of material can be determined by one skilled in the art considering the service temperature and gas environment when operational. Materials such as nickel base alloys or molybdenum may be suitable in some situations.

Wafer heater assemblies according to the present disclosure may additionally or alternatively include the feature of securing or gripping the wafer to the wafer heater by an electrical force providing a force augmenting the weight of the wafer. Referring to FIG. 4A, an electric field may be applied between the electrode (or a set of electrodes) 260 and the wafer 150. The non-porous outermost layer 220 in the case where an electric field is applied between electrode 260 and wafer 150 has a resistivity greater than about $10^3$ ohm-cm at the service temperature; more preferably between about $10^9$ and about $10^{10}$ ohm-cm, about $10^3$ ohm-cm, about $10^4$ ohm-cm, about $10^5$ ohm-cm, about $10^6$ ohm-cm, about $10^7$ ohm-cm, about $10^8$ ohm-cm, about $10^9$ ohm-cm, or about $10^{10}$ ohm-cm, or within any range defined between any two of the foregoing value, at the service temperature (which is between about 200° C. and about 700°

C., about 200° C., about 250° C., about 300° C., about 350° C., about 400° C., about 450° C., about 500° C., about 550° C., about 600° C., about 650° C., or about 700° C., or within any range defined between any two of the foregoing values). In other words, non-porous outermost layer 220 may not be very conductive, else there will be no electric field between wafer and the wafer heater and hence no gripping force. In such a configuration, the wafer heater assembly 400 serves as an electrostatic chuck. In some embodiments, wafer heater assemblies according to the present disclosure may include a plurality of electrodes, i.e., an electrode or electrode set, to provide both a securing or gripping force and RF activation of a plasma.

Wafer heater assemblies, such as those illustrated in FIGS. 1-4, may include wafer heater components, namely the heater substrate 210 and/or the non-porous outermost layer 220, that are homogeneous. In other embodiments, wafer heater components such as the heater substrate 210 and/or the non-porous outermost layer 220 may be inhomogeneous, which may at least in part be dictated by processing conditions. Challenges exist in configuring heater substrates, such as those made from high thermal conductivity silicon nitride according to the present disclosure, to include intricate electrical structures. In some instances, it may be necessary to make wafer heaters by first making a thick homogeneous blank of silicon nitride having a first conductivity, $\eta_1$ (which can be between about 25 W/mK and about 120 W/mK, in some embodiments about 25 W/mK, about 30 W/mK, about 35 W/mK, about 40 W/mK, about 45 W/mK, about 50 W/mK, about 55 W/mK, about 60 W/mK, about 65 W/mK, about 70 W/mK, about 80 W/mK, about 85 W/mK, about 90 W/mK, about 95 W/mK, about 100 W/mK, about 105 W/mK, about 110 W/mK, about 115 W/mK, or about 120 W/mK, or within any range defined between any two of the foregoing values) for example, and subsequently forming onto that blank any required electrical structures in a matrix of silicon nitride having a second $\eta_2$ (which can be between about 15 W/mK and about 119 W/mK, about 20 W/mK, about 30 W/mK, about 40 W/mK, about 50 W/mK, about 60 W/mK, about 70 W/mK, about 80 W/mK, about 90 W/mK, about 100 W/mK, about 110 W/mK, about 115 W/mK, or about 119 W/mK, or within any range defined between any two of the foregoing values) where $\eta_2$ is lower than $\eta_1$. Geometry limitations may require that the functional elements such as heating elements, interconnect, vias, leads, and the like be formed in one operation and machined flat. In these and other embodiments, the RF electrode and the non-porous outermost layer are applied in a subsequent step.

Wafer heater assemblies according to the present disclosure may include heating elements arranged in a single zone, dual zones, or in multiple zones to form a wafer heater assembly, a dual wafer heater assembly, or a multi-zone wafer heater assembly, respectively. Increasing the number of zones enables more control over temperature uniformity within a wafer. The heating elements 240 of plane 245 as illustrated in FIG. 2 provide a wafer heater assembly having a single heating plane. In other embodiments, heating elements are disposed on multiple planes in order to provide a multi-zone wafer heater assembly architecture offering more flexibility and the ability to rapidly respond to local temperature fluctuations.

Zones may be disposed in a coplanar fashion in various ways, for example, radiating outward or arranged side-by-side in a rectangular grid array or another configuration. Additionally, zones may be arranged on different planes parallel to each other with a plurality of zones in each plane, again in a radiating pattern, a rectangular grid array, or another configuration.

Figure 4C:
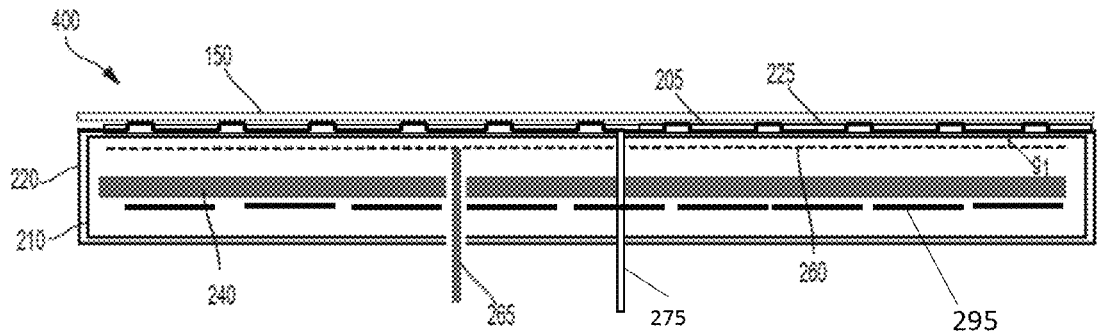
FIG. 4C illustrates a cross-sectional view of a wafer heater assembly with a resistance temperature detector (RTD) layer.

Wafer heater assemblies according to the present disclosure may include multizone, multiplexed wafer heaters. The term "multiplexed heaters" is used herein to denote that several heating elements may share at least some common leads while the power to the heating elements is at least partially independently adjustable. Advantageously, multizone, multiplexed wafer heaters are able to minimize the number of electrical connections while powering the heater zones, which is further described in U.S. Pat. No. 9,324,589, and incorporated herein by reference. Wafer heater assemblies 200 and 300, as illustrated in FIGS. 2 and 3 for example, can be configured to further include an optional resistance temperature detector (RTD) layer, as illustrated in FIG. 4C, to measure temperatures at desired locations, including below individual heater zones. Alternatively, the resistance of each heater zone may be monitored to determine the temperature of each zone within the previously calibrated wafer heater assembly. The wafer heater assembly may further be combined with a multiplexing control scheme to power and regulate each depending on the temperature feedback while minimizing the number of leads required to power the entire wafer heater assembly. FIG. 4C includes the RTD layer comprising at least one RTD 291. The RTD 291 of the RTD layer can be in the same plane, or in various planes.

Silicon Nitride as Heater Substrate.

Silicon nitride is not generally known to have adequate corrosion resistance to fluorine-based plasmas, for example, and therefore has not been used as a substrate for conventional wafer heaters. Plasma corrosion resistant coatings according to the present disclosure provide corrosion resistance to silicon nitride heater substrates. These non-porous outermost protective layers for silicon nitride wafer heaters include protective layers comprising rare earth silicates such as ytterbium disilicate ($Yb_2Si_2O_7$) and yttrium disilicate ($Y_2Si_2O_7$). Laminates of ytterbium disilicate or yttrium disilicate on silicon nitride substrates were fabricated via hot pressing and the sintered microstructures were examined. The ytterbium disilicate protective layer resulted in better adhesion to the silicon nitride with an interface containing fewer pores or cracks in comparison to the yttrium disilicate layers. Plasma etch testing of the ytterbium disilicate protective layer on a silicon nitride substrate in a tetrafluoromethane ($CF_4$) plasma environment showed three to four times greater etch resistance as compared with a conventional aluminum nitride heater (as in Examples, Table 2). Wafer heaters having an ytterbium disilicate non-porous outermost layer on a silicon nitride heater substrate according to the present disclosure are also useful in multizone, multiplexed heaters for semiconductor wafer processing applications.

Figure 5:
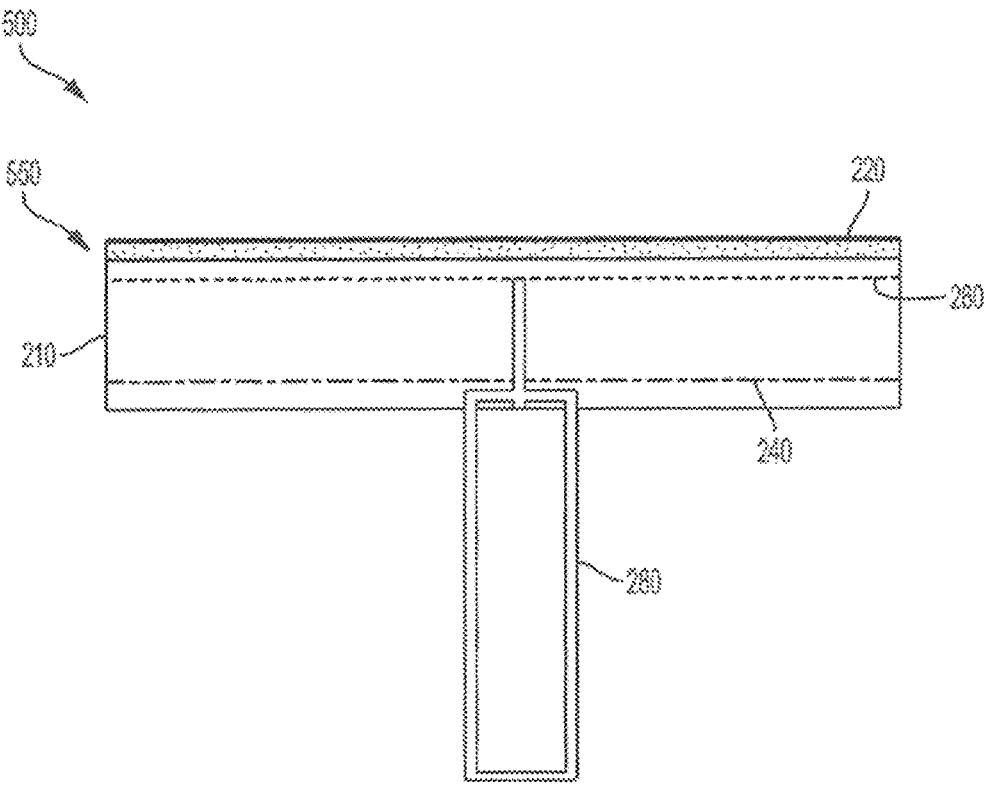
FIG. 5 illustrates a cross-sectional view of a wafer heater assembly having a non-porous outermost layer.

FIG. 5 illustrates a cross-sectional view of a wafer heater 500, similar to the wafer heater 110 illustrated in FIG. 1, according to some embodiments. A corrosion-resistant protective layer including a rare-earth silicate is advantageously joined with a ceramic substrate and/or other layers to provide a laminate, wherein the outermost layer is non-porous. The wafer (not shown) sits atop the non-porous outermost layer 220 on heater substrate 210, the heater substrate and non-porous outermost layer together forming laminate 550. Non-porous outermost layer 220 need not encapsulate the heater substrate 210 as illustrated in FIGS. 2-4 and may be disposed on the wafer side only of the laminate as illustrated in FIGS. 5-9. Heater substrate has at least one heating element 240 embedded therein and also, optionally, metal radio frequency (RF) shield 260. In some embodiments, the heater substrate 210 is silicon nitride. In some embodiments, the heater substrate 210 comprises aluminum nitride. During operation, the heater is sometimes cleaned with fluorine-containing gas. If the temperature of the heater exceeds about 500° C., then the heater itself may be attacked by the fluorine thus making a corrosion-resistant protective layer included onto the 'hot' parts necessary. In embodiments of the disclosure, heater substrate 210 includes non-porous outermost layer 220 and optional interposing layer(s) therebetween. Non-porous outermost layer 220 includes an outer surface for holding the wafer. As previously detailed, i.e., as for portion 221 having $\rho_1$ of FIG. 3, the non-porous outermost layer 220 in region of wafer heater 110 directly under the wafer should be dense. Otherwise particles from the heater would tend to be shed onto the underside of the wafer. These shed particles could migrate to the top side of the wafer in a subsequent step, which would in turn result in defects in the patterns on the wafer. The sides, bottom and coverage on the supporting disk (or shaft) 280 of the wafer heater are less critical, as there is no direct path for particles to migrate to the wafer. A plasma spray coating may suffice to prevent against contamination for these other regions.

Figure 6:
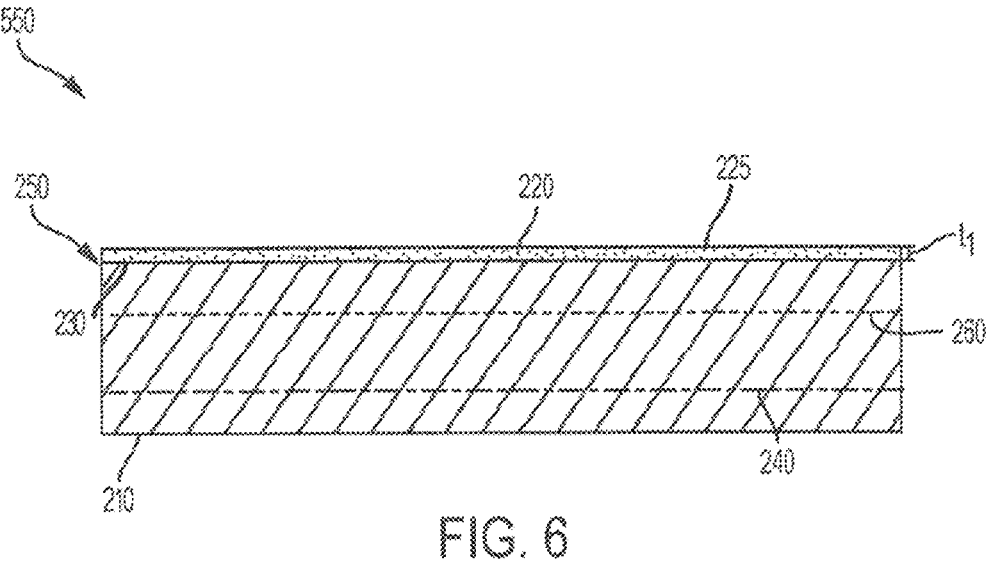
FIG. 6 illustrates a cross-sectional detailed view of the laminate shown in FIG. 5.

FIG. 6 illustrates a cross-sectional detailed schematic view of the laminate 550 illustrated in FIG. 5 including heater substrate 210 and a non-porous outermost layer 220. Outermost layer 220 includes a first surface 225, a second surface 230, and a thickness $t_1$ therebetween, which can be between about 0.005 cm and about 1 cm, in some embodiments about 0.005 cm, about 0.02 cm, about 0.01 cm, about 0.05 cm, about 0.1 cm, about 0.15 cm, about 0.2 cm, about 0.3 cm, about 0.5 cm, about 0.6 cm, about 0.7 cm, about 0.8 cm, about 0.9 cm, about 1.0 cm, or within any range defined between any two of the foregoing values. Laminate 550 further includes interface 250 (i.e., between the outer layer and the body of the heater) at which surface 230 of the non-porous outermost layer 220 is adhered to the heater substrate 210. Surface 225 of layer 220 is exposed and is configured to contact a wafer (not shown) for heating. Laminate further includes at least one heating element 240 embedded in heater substrate 210 and also, optionally, metal radio frequency (RF) shield 260.

Figure 7:
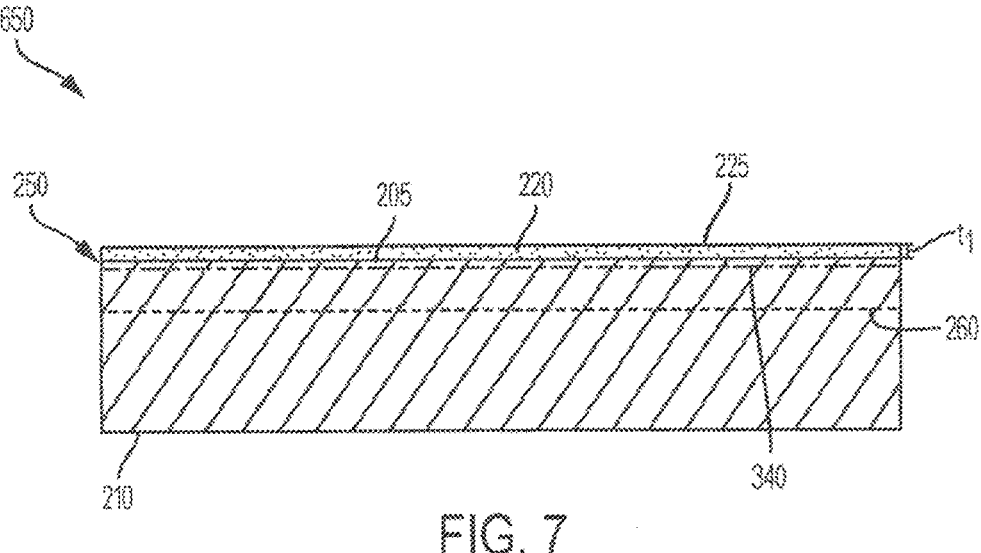
FIG. 7 illustrates another laminate configuration, wherein the heating element is in close proximity to the non-porous outermost layer.

Other laminate configurations are contemplated in accordance with the present disclosure. Laminate 650 of FIG. 7 illustrates another configuration for wafer heaters according to the present disclosure similar to laminate 550 of FIG. 6 except that heating element 340 is in close proximity to non-porous outermost layer 220. The heating element 340 can be between about 5 µm and about 2 mm, in some embodiments about 5 µm, about 25 µm, about 50 µm, about 100 µm, about 150 µm, about 200 µm, about 250 µm, about 300 µm, about 350 µm, about 400 µm, about 450 µm, about 500 µm, about 550 µm, about 600 µm, about 650 µm, about 700 µm, about 750 µm, about 800 µm, about 850 µm, about 900 µm, about 950 µm, about 1000 µm, about 1.1 mm, about 1.2 mm, about 1.3 mm, about 1.4 mm, about 1.5 mm, about 1.6 mm, about 1.7 mm, about 1.8 mm, about 1.9 mm, or about 2.0 mm, or within any range defined between any two of the foregoing values, or about in some embodiments at least about 10 µm, below top surface 205 of substrate 210 to avoid electrical issues. Laminate 750 of FIG. 8 illustrates another configuration for wafer heaters according to the present disclosure similar to laminate 550 of FIG. 6 wherein heating element 340 is in close proximity to non-porous outermost layer 220 but optional RF shield 260 has been eliminated, and wherein the thickness $tt_1$ can be between about 10 μm and about 3 mm, in some embodiments, about 10 μm, about 20 μm, about 25 μm, about 30 μm, about 35 μm, about 40 μm, about 45 μm, about 50 μm, about 55 μm, about 60 μm, about 65 μm, about 70 μm, about 75 μm, about 80 μm, about 85 μm, about 90 μm, about 100 μm, about 500 μm, about 1000 μm, about 1.5 mm, about 2 mm, about 2.5 mm, or about 3.0 mm, or within any range defined between any two of the foregoing values.

Figure 8:
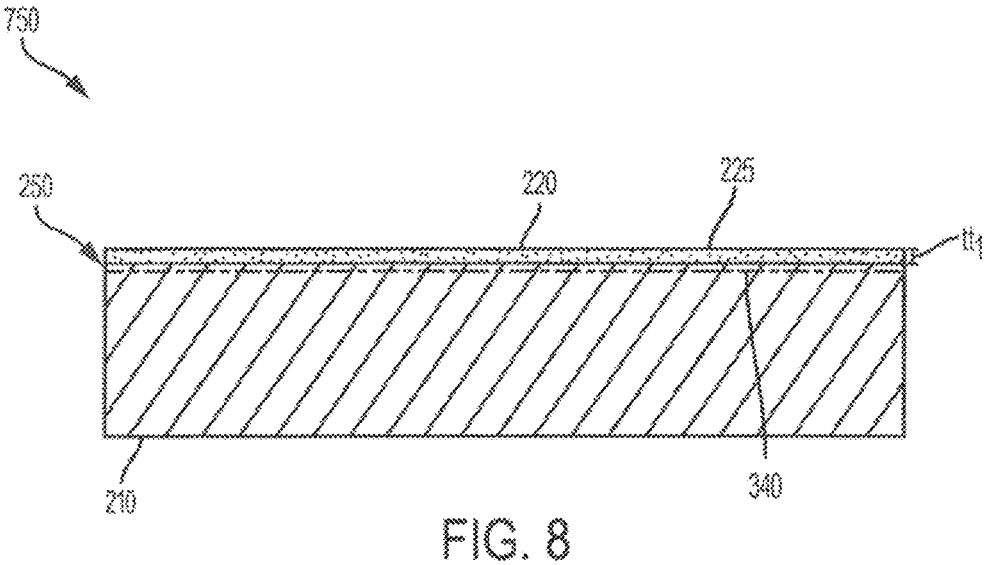
FIG. 8 illustrates another laminate configuration, similar to the laminate configuration as in FIG. 7 but without an RF shield.
Figure 9:
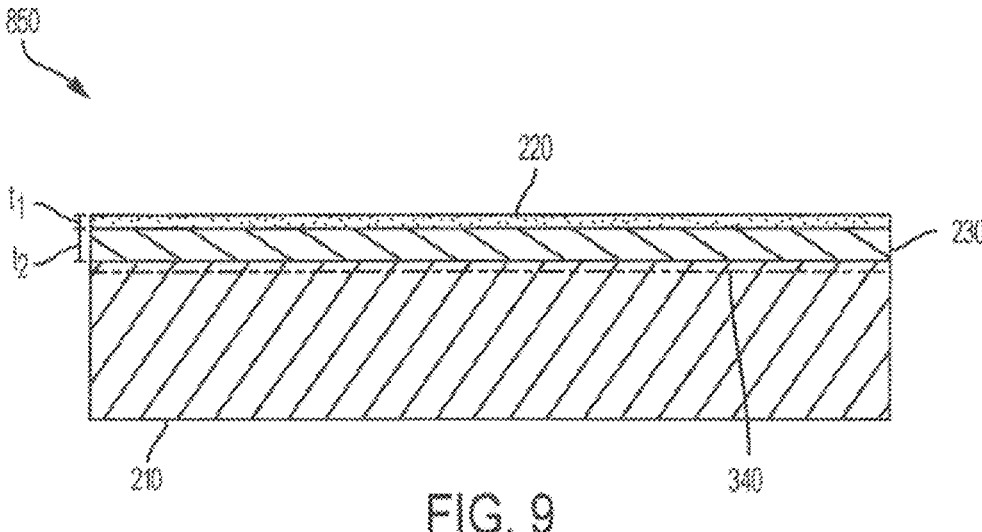
FIG. 9 illustrates another laminate configuration, similar to the laminate configuration as in FIG. 8 but having an interposing layer 230 disposed between the non-porous outermost layer and the heater substrate.

FIG. 9 illustrates laminate 850 having another configuration for wafer heaters according to the present disclosure similar to laminate 750 of FIG. 8 except that heating element 340 is in close proximity to an interposing layer 230 disposed between non-porous outermost layer 220 and heater substrate 210. Interposing layer 230 has thickness $t_2$, which is between about 2 μm and about 3 mm, in some embodiments about 2 μm, about 25 μm, about 50 μm, about 100 μm, about 200 μm, about 300 μm, about 400 μm, about 500 μm, about 600 μm, about 700 μm, about 800 μm, about 900 μm, about 1000 μm, about 1.5 mm, about 2 mm, about 2.5 mm, about 3.0 mm, or within any range defined between any two of the foregoing values. A material for the interposing layer 230 can be a rare earth mono-silicate $(Re_2SiO_5)$, a silicon oxynitride, a rare earth oxide $(Re_2O_3)$ or the electrode discussed herewith, or combinations thereof. Use of an interposing layer 230 provides the advantage that the non-porous layer 220 need not be as closely compatible (i.e., in terms of material properties such as coefficient of thermal expansion, and in terms of chemical compatibility) with the bulk material of heater substrate 210 and/or with the heating element 340. The heating element 340 can be located between about 5 μm and about 5 mm, in some embodiments about 25 μm, about 50 μm, about 100 μm, about 200 μm, about 300 μm, about 400 μm, about 500 μm, about 600 μm, about 700 μm, about 800 μm, about 900 μm, about 1000 μm, about 1.5 mm, about 2 mm, about 2.5 mm, about 3.0 mm, about 3.5 mm, about 4 mm, about 4.5 mm, or about 5.0 mm, or within any range defined between any two of the foregoing values, from the top surface of the non-porous layer 220. The interposing layer 230 can also prevent chemical reactions between the outer layer and the bulk of the heater, and/or reduce stresses from the materials differences. In some embodiments, the electrodes can be buried in the interposing layer 230.

The heater substrate 210 of FIGS. 2-9 may comprise silicon nitride. Silicon nitride offers greater thermal shock resistance over conventional heater materials such as aluminum nitride and alumina. This material choice provides faster heat-up and cool-down times in the reactor, thus advantageously increasing wafer throughput and tool productivity when used in semiconductor wafer processing. Heater substrate 210 according to the present disclosure may include additives to the silicon nitride to tailor properties of the silicon nitride for use as wafer heaters. A variety of additives may be used, individually or in combination. Suitable additives used to improve sintering can include rare earth oxides, alkaline earth oxides, alumina, silica and possibly lithium and fluorine compounds, or combinations thereof. Additives to improve resistivity can include silicon carbide or boron nitride, or combinations thereof. Additives to improve thermal expansion behavior can include refractory metals and their compounds. Some additives can have more than one function. The total amount of additives can range between 2 vol. % and 55 vol. % of the fired product, and can vary depending on the application requirements. In some embodiments, the total amount of the additive can be about 2 vol. %, about 5 vol. %, about 10 vol. %, about 15 vol. %, about 20 vol. %, about 25 vol. %, about 30 vol. %, about 35 vol. %, about 40 vol. %, about 45 vol. %, or about 50%, or within a range defined by any two of the foregoing values.

Heater substrates 210 comprising silicon nitride according to the present disclosure include a mixture of equiaxed α-phase silicon nitride grains and acicular β-phase silicon nitride grains, a silicide phase, and a rare earth disilicate glass phase. Heater substrates 210 according to the present disclosure are sintered bodies having a density that approaches the theoretical density, in other words having a density that is greater than about 99% of the theoretical density, with little or no porosity present in the microstructure.

The starting raw material for heater substrates 210 comprising silicon nitride include high purity grade silicon nitride powders. The surface areas of the high purity grade silicon nitride powders can be between about 1 $m^2/g$ and about 20 $m^2/g$, in some embodiments about 1 $m^2/g$, about 3 $m^2/g$, about 5 $m^2/g$, about 7 $m^2/g$, about 9 $m^2/g$, about 11 $m^2/g$, about 13 $m^2/g$, about 15 $m^2/g$, about 17 $m^2/g$, or about 20 $m^2/g$, or within any range defined between any two of the foregoing values. In some embodiments, the silicon nitride has a surface area of about 10 $m^2/g$. Silicon nitride powders having a surface area less than about 1 $m^2/g$ may be difficult to densify. Silicon nitride powders having a surface area greater than about 20 $m^2/g$ are expensive and may contain higher amounts of impurities (such as oxygen) from particle size reduction operations such as milling.

In terms of purity, it is preferable that the total amount of uncontrolled impurities in the starting raw materials for the heater substrates be between about 0 ppm to about 10,000 ppm, in some embodiments about 0 ppm, about 50 ppm, about 100 ppm, about 150 ppm, about 200 ppm, about 250 ppm, about 300 ppm, about 400 ppm, about 500 ppm, about 600 ppm, about 700 ppm, about 800 ppm, about 900 ppm, about 1,000 ppm, about 2,500 ppm, about 3,000 ppm, about 4,000 ppm, about 5,000 ppm, about 6,000 ppm, about 7,000 ppm, about 8,000 ppm, about 9,000 ppm, about 10,000 ppm, or within any range defined between any two of the foregoing values, in some embodiments less than about 10,000 ppm (or 1%). If the total impurity content is greater than about 10,000 ppm, the elevated temperature properties of the silicon nitride heater substrates may be impacted negatively.

The silicon nitride raw material powder includes a mixture of equiaxed α-phase silicon nitride grains $(\alpha$-$Si_3N_4)$ and acicular β-phase silicon nitride grains $(\beta$-$Si_3N_4)$. Preferably, the silicon nitride powder comprises a major portion of the α phase and a minor proportion of β phase.

The silicon nitride α-phase in the silicon nitride raw powder can be present in an amount of between about 85 wt. % and about 100 wt. %, in some embodiments about 90 wt. %, about 92 wt. %, about 94 wt. %, about 98 wt. %, about 99 wt. %, or about 100 wt. %, or within any range defined between any two of the foregoing values, based on the total weight of silicon nitride. The balance of the silicon nitride can comprise β-phase silicon nitride and at most 1 wt. % of impurities. The raw powder should include a major portion of the α-phase silicon nitride grains $(\alpha$-$Si_3N_4)$ so that the final sintered microstructure consists of elongated grains of β-phase silicon nitride due to the conversion of α to β-phase at a temperature of between about 1400° C. and about 1700° C. during sintering. A microstructure that exhibits predominantly elongated grains of β-phase silicon nitride provides for improved fracture toughness in the material.

Sintered silicon nitride heater substrates according to the present disclosure are prepared from a raw batch comprising between about 60 mole % and 99 mole % silicon nitride. In some embodiments, the raw batch can include about 60 mole %, about 65 mole %, about 70 mole %, about 75 mole %, about 80 mole %, about 85 mole %, about 90 mole %, about 95 mole %, or about 99 mole % silicon nitride, or within any range defined between any two of the foregoing values based on the raw batch total moles. The raw batch may further include, as sintering aids, between about 1 mole % and about 10 mole % of a RE oxide based on the total moles of the raw batch. In some embodiments, the sintering aid of the raw batch can be at a mole percentage of about 1 mole %, about 2 mole %, about 3 mole %, about 5 mole %, about 7 mole %, about 8 mole %, about 9 mole %, or about 10 mole %, or within any range defined between any two of the foregoing values RE oxides based on the total moles of raw batch. In some embodiments, the raw batch can include between about 0 mole % and about 20 mole % of a silica. In some embodiments, the raw batch can include about 0 mole %, about 1 mole %, about 5 mole %, about 10 mole %, about 15 mole %, or about 20 mole %, or within any range defined between any two of the foregoing values of silica based on the total moles of raw batch. The silica and rare earth oxide form a rare earth disilicate glass phase. Examples RE silicates include, but are not limited to, compounds according to the general formula $RE_2Si_2O_7$, having a ratio of about 1 $RE_2O_3$ to about 2 $SiO_2$ in the binary system. Rare earth oxides are chosen from at least one oxide of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), yttrium (Y), and combinations thereof. Sintering aids may be added to minimize porosity, reduce grain size, and/or to enable less extreme processing conditions to be employed (for example, lower pressures in hot pressing) for sintering. Sintering aids may also provide for higher thermal coefficient of expansion (CTE) of the silicon nitride. In some embodiments, the raw batch can further include an organic material, such as a solvent such as methyl ethyl ketone, toluene, cyclohexanone, and combinations thereof, including a ternary solvent system of these solvents. The organic material can be present in the raw batch in an amount between about 10 wt. % and about 25 wt. % of the total batch formulation. In some embodiments, the organic material can be present in the raw batch in an amount of about 10 wt. %, about 15 wt. %, about 20 wt. %, or about 25 wt. %, or within any range defined between any two of the foregoing values. The raw batch material can further include at least one polymeric material, which can be the balance of the total batch formulation, The polymeric materials can be a dispersant, for example Hypermer™ KD-1 (Croda); a binder, for example Paraloid™ B-72 (Dow Chemical); and at least one plasticizer, such as a Type I plasticizer, for example Santicizer® S-160 (Valtris), and/or a Type II plasticizer, such as UCON™ 50-HB 5100 (Dow Chemical).

Heater substrates comprising silicon nitride according to the present disclosure can have a thermal conductivity, η, of from about 25 W/mK to about 120 W/mK, in some embodiments about 25 W/mK, about 30 W/mK, about 35 W/mK, about 40 W/mK, about 45 W/mK, about 50 W/mK, about 55 W/mK, about 60 W/mK, about 65 W/mK, about 70 W/mK, about 75 W/mK, about 80 W/mK, about 85 W/mK, about 90 W/mK, about 95 W/mK, about 100 W/mK, about 105 W/mK, about 110 W/mK, about 115 W/mK, about 120 W/mK, or about 125 W/mK, or within any range defined between any two of the foregoing value. A coefficient of thermal expansion, CTE, of the heated substrates can be from about $3 \times 10^{-6}$ per ° C. to about $5 \times 10^{-6}$ per ° C., in some embodiments about $3 \times 10^{-6}$ per ° C., about $4 \times 10^{-6}$ per ° C., or about $5 \times 10^{-6}$ per ° C., or within any range defined between any two of the foregoing value. The density of the heated substrate, which can be different at different locations of the heated substrate can be between about 3.3 g/cc to about 3.7 g/cc, in some embodiments about 3.3 g/cc, about 3.4 g/cc, about 3.5 g/cc, about 3.6 g/cc, or about 3.7 g/cc, or within any range defined between any two of the foregoing value.

The heater substrate average grain size of the silicon nitride can be between about 0.05 μm and about 5 μm, in some embodiments about 0.05 μm, about 0.1 μm, about 0.2 μm, about 0.3 μm, about 0.4 μm, about 0.6 μm, about 0.8 μm, 1.0 μm, about 2 μm, about 3 μm, about 4 μm, or about 5.0 μm, or within any range defined between any two of the foregoing values.

After sintering and converting alpha silicon nitride to beta silicon nitride, the heater substrate may include between about 10 vol. % and about 99 vol. % of the beta silicon nitride, in some embodiments about 10 vol. % $\beta$-$Si_3N_4$, about 20 vol. % $\beta$-$Si_3N_4$, about 25 vol. % $\beta$-$Si_3N_4$, about 30 vol. % $\beta$-$Si_3N_4$, about 35 vol. % $\beta$-$Si_3N_4$, about 40 vol. % $\beta$-$Si_3N_4$, about 45 vol. % $\beta$-$Si_3N_4$, about 50 vol. % $\beta$-$Si_3N_4$, about 55 vol. % $\beta$-$Si_3N_4$, about 60 vol. % $\beta$-$Si_3N_4$, about 65 vol. % $\beta$-$Si_3N_4$, about 70 vol. % $\beta$-$Si_3N_4$, about 75 vol. % $\beta$-$Si_3N_4$, about 80 vol. % $\beta$-$Si_3N_4$, about 85 vol. % $\beta$-$Si_3N_4$, or about 90 vol. % $\beta$-$Si_3N_4$, about 95 vol. % $\beta$-$Si_3N_4$, about 98 vol. % $\beta$-$Si_3N_4$, or 99 vol. % $\beta$-$Si_3N_4$, or within any range defined between any two of the foregoing values based on the total volume of silicon nitride. The remaining silicon nitride can be alpha silicon nitride.

Other Additives for Silicon Nitride Heater Substrate.

Additionally or alternatively to the additives described above, silicon nitride heater substrates may include additives that modify selected properties of interest. In one non-limiting example metal layers are incorporated in the silicon nitride heater substrate, for example as heating elements (i.e., heating elements 240 as in FIG. 2-6 or 340 as in FIG. 7-9) or as RF electrodes (i.e., RF electrode 260 as in FIG. 4-7), it is necessary that the CTE of the metal layer and the silicon nitride be matched as closely as possible. Preferably, the CTE's are matched within between about $0 \times 10^{-6}$ per ° C. and about $4 \times 10^{-6}$ per ° C. differential between the metal and the silicon nitride, and more preferably matched with a differential of less than $1 \times 10^{-6}$ per ° C. to avoid potential defects such as pores, cracks, and the like that may result at the interface between the metal and the silicon nitride. These defects are either observed after processing or develop during service due to the thermal stresses generated.

To modify the effective CTE and elastic modulus, additives that have a higher or lower CTE (and elastic modulus) than silicon nitride can be included provided its inclusion does not interfere with densification or otherwise adversely affect desirable properties in the final heater substrate body. Interference can be determined if there is porosity, microcracking, or agglomeration associated with the additive particles. CTE modifiers include, but are not limited to, compounds of refractory metal elements such as Ti, Ta, Hf, W, Mo, Zr, V, alloys thereof, and combinations thereof. The amount of the CTE modifying additive(s) should be such that when added at a minimum level there is a noticeable impact on CTE. On the other hand, the maximum level of such additive(s) should not result, for example, in the degradation of the insulation characteristic of silicon nitride at either room or elevated temperatures representative of the application. The total amount of CTE modifying additives added to the raw batch may be between about 0.5 mole % and about 15 mole %, in some embodiments about 0.5 mole %, about 1.0 mole %, about 2 mole %, about 3 mole %, about 4 mole %, about 5 mole %, about 6 mole %, about 7 mole %, about 8 mole %, about 9 mole %, about 10 mole %, about 11 mole %, about 12 mole %, about 13 mole %, about 14 mole %, or about 15 mole %, or within any range defined between any two of the foregoing values, based on the total weight of the raw batch for the heater substrate.

While the thermal conductivity of silicon nitride (typically around 25 W/mK) is less than aluminum nitride (typically between about 100-150 W/mK), the use of higher thermal conductivity silicon nitride (typically 80 W/mK or higher) and/or multiple zones of heaters can overcome any thermal non-uniformity. Accordingly, other additives in the raw batch silicon nitride composition can modify the thermal conductivity (and electrical properties) of the resulting silicon nitride body. Examples of such additives include, but are not limited to, MgO (as in U.S. Pat. No. 6,391,812, incorporated herein by reference), BN, and SiC, and combinations thereof. The total amount of additives added to the raw batch to adjust the thermal conductivity can be between about 0.1 mole % and about 15 mole %, in some embodiments about 0.1 mole %, 0.5 mole %, about 1 mole %, about 2 mole %, about 3 mole %, about 4 mole %, about 5 mole %, about 6 mole %, about 7 mole %, about 8 mole %, about 9 mole %, about 10 mole %, about 11 mole %, about 12 mole %, about 13 mole %, about 14 mole %, or about 15 mole %, or within any range defined between any two of the foregoing values, based on the total weight of the raw batch for the heater substrate.

The heater substrate thickness after densification can be between about 5 mm and about 50 mm, in some embodiments about 5 mm, about 7 mm, about 10 mm, about 12 mm, about 14 mm, about 16 mm, about 18 mm, about 20 mm, about 22 mm, about 24 mm, about 26 mm, about 28 mm, about 30 mm, about 35 mm, about 40 mm, about 45 mm or about 50 mm, or within any range defined between any two of the foregoing values.

Metal Layers as Heating Elements, Heating Element Layer, or Heating Element Zone and/or as RF Electrodes.

Wafer heater assemblies according to the present disclosure may include metal layers having compositions based on refractory metals that are compatible with and incorporated into the heater substrate. Such metal layers are useful as heating elements, one or more heating element layer(s), or one or more heating element zone(s), and/or as RF electrodes to transmit RF energy. In a heater substrate, these metal layers serve different functions and accordingly have different electrical properties. Metal layers may have an electrical resistivity of from about 100 ohm·cm at room temperature to about $1 \times 10^{-6}$ ohm·cm at room temperature. In all cases, the CTE of such layers are closely matched to the heater substrate, such as a silicon nitride heater substrate, that they are embedded in. Preferably, the CTE match between the metal layer and silicon nitride is between about $0 \times 10^{-6}$ per ° C. and about $4 \times 10^{-6}$ per ° C. differential between the metal and the silicon nitride, in some embodiments better than about $2 \times 10^{-6}$ per ° C., and more preferably matched with a differential of less than about $1 \times 10^{-6}$ per ° C.

Refractory metals suitable according to the present disclosure include, but are not limited to, elements and compounds of Mo, W, Hf, Rh, Ti, Ta, Zr, V, and combinations thereof. The metal layer may consist of refractory metal compounds alone or refractory metals alone or composites of refractory metal compounds, refractory metal, silicon nitride, sintering aids, other property modifying additives, and combinations thereof.

The metal layer composition depends on the desired target electrical properties and the compatibility of this layer with the surrounding silicon nitride. The metal content of the metal layer may be from about 5 volume percent to about 100 volume percent (pure metal) of the layer, in some embodiments about 5 vol. %, about 10 vol. %, about 15 vol. %, about 20 vol. %, about 25 vol. %, about 30 vol. %, about 35 vol. %, about 40 vol. %, about 45 vol. %, about 50 vol. %, about 55 vol. %, about 60 vol. %, about 65 vol. %, about 70 vol. %, about 75 vol. %, about 80 vol. %, about 85 vol. %, about 90 vol. %, about 95 vol. %, or about 100 vol. %, or within any range defined between any two of the foregoing values. The metal layer may be a composite further include at least one of silicon nitride, sintering aids as used in the processing of silicon nitrides, CTE modifying additives, and combinations thereof. Accordingly, these other constituents can be included in the composite in a total amount of between about 0 to about 95 volume percent of the total volume of the composite, with the sintering aids, which may include $SiO_2$, representing between about 1 mole percent to 20 mole percent, in some embodiments about 1 mole %, about 5 mole %, about 10 mole %, about 15 mole %, or about 20 mole % of the total amount of the silicon nitride, or within any range defined between any two of the foregoing values. CTE modifying additives in the metal layer include, but are not limited to, BN, SiC, $SiO_2$, and combinations thereof. Section of the metal layer and additives to be used with the heater substrate necessarily takes into consideration preventing the formation of undesirable phases as a result of a reaction between any of the metal layer, the additives employed, and the silicon nitride substrate. Reactions may occur during the fabrication of the heater or during service.

Since silicon nitride inherently does not have good plasma corrosion resistance to fluorine-based plasmas commonly used in chamber cleaning recipes, it needs to be protected from such attack. Non-porous outermost layers comprising rare earth silicate coatings are coated, layered, laminated, adhered, or otherwise associated with the silicon nitride heater substrate and co-fired to form a dense corrosion barrier with excellent adhesion to the silicon nitride heater substrate. Rare earth silicate layers may be fabricated from their powders directly or synthesized indirectly from a mixture of their constituent ingredients as will be described. Non-Porous Outermost Layer.

Wafer heater assemblies according to the present disclosure include non-porous outermost layers as corrosion protective layers for heater substrates. Non-porous outermost layers comprise at least one rare earth silicate chosen from ytterbium disilicate ($Yb_2Si_2O_7$) and yttrium disilicate ($Y_2Si_2O_7$). Preferably layer 220, as in FIGS. 2-9, is ytterbium disilicate for laminating with heater substrates comprising silicon nitride.

The rare earth silicate layer may be synthesized during co-densification with the underlying silicon nitride heater substrate. As illustrated in FIG. 6, laminate 550 includes interface 250 at which surface 230 of the non-porous outermost layer 220 is adhered to the heater substrate 210. Secondary phases or pores at interface 250 contribute to undesired cracking or delamination of the protective coating. The non-porous outermost layer 220 of the present disclosure includes between about 0 vol. % and about 5 vol. % of undesirable phases or pores at interface 250, or between about 0 vol. % and about 3 vol. % of undesirable phases or pores, or between 0 vol. % and about 1 vol. % of undesirable phases or pores. In some embodiments, the undesirable phases or pores of the non-porous outermost layer is about 0 vol. %, about 0.5 vol. %, about 1 vol. %, about 1.5 vol. %, about 2 vol. %, about 2.5 vol. %, about 3 vol. %, about 3.5 vol. %, about 4 vol. %, about 4.5 vol. %, or about 5 vol. %, or within any range defined between any two of the foregoing values.

A green layer of rare earth silicate may be prepared from silica ($SiO_2$) and ytterbia ($Yb_2O_3$), as well as optional organic additives for green, unfired strength, with the silica to ytterbia molar ratio being carefully controlled. An example of the fabrication of the outermost layer from constituents is detailed in Example 2. For a $SiO_2$:$Yb_2O_3$ below a molar ratio of about 1.8, the resulting microstructure of the sintered outermost layer demonstrates deleterious fine cracks and comprises undesirable phases such as ytterbia ($Yb_2O_3$) and ytterbium monosilicate ($Yb_2SiO_5$). It was observed that as the molar ratio approaches about 2.0, the microstructure shows less cracking and comprises ytterbium monosilicate ($Yb_2SiO_5$) phase. At a molar ratio of about 2.0 or slightly greater (about 2.3), the microstructure comprises ytterbium monosilicate ($Yb_2SiO_5$) and ytterbium disilicate ($Yb_2Si_2O_7$). At molar ratios between about 2.4 and about 2.7, the sintered outermost layer comprises substantially ytterbium disilicate ($Yb_2Si_2O_7$) phase and demonstrates no observable cracks. For a $SiO_2$:$Yb_2O_3$ with a molar ratio greater than about 3.0, the resulting microstructure demonstrates porosity and a presence of $SiO_2$—both of which are undesirable. In some embodiments, the $SiO_2$ to $Yb_2O_3$ molar ratio ($SiO_2$:$Yb_2O_3$) may be from about 1.8 $SiO_2$:$Yb_2O_3$ to about 3.0 $SiO_2$:$Yb_2O_3$; from about 1.9 $SiO_2$:$Yb_2O_3$ to about 2.7 $SiO_2$:$Yb_2O_3$; or from about 2.4 $SiO_2$:$Yb_2O_3$ to about 2.7 $SiO_2$:$Yb_2O_3$.

Figure 10:
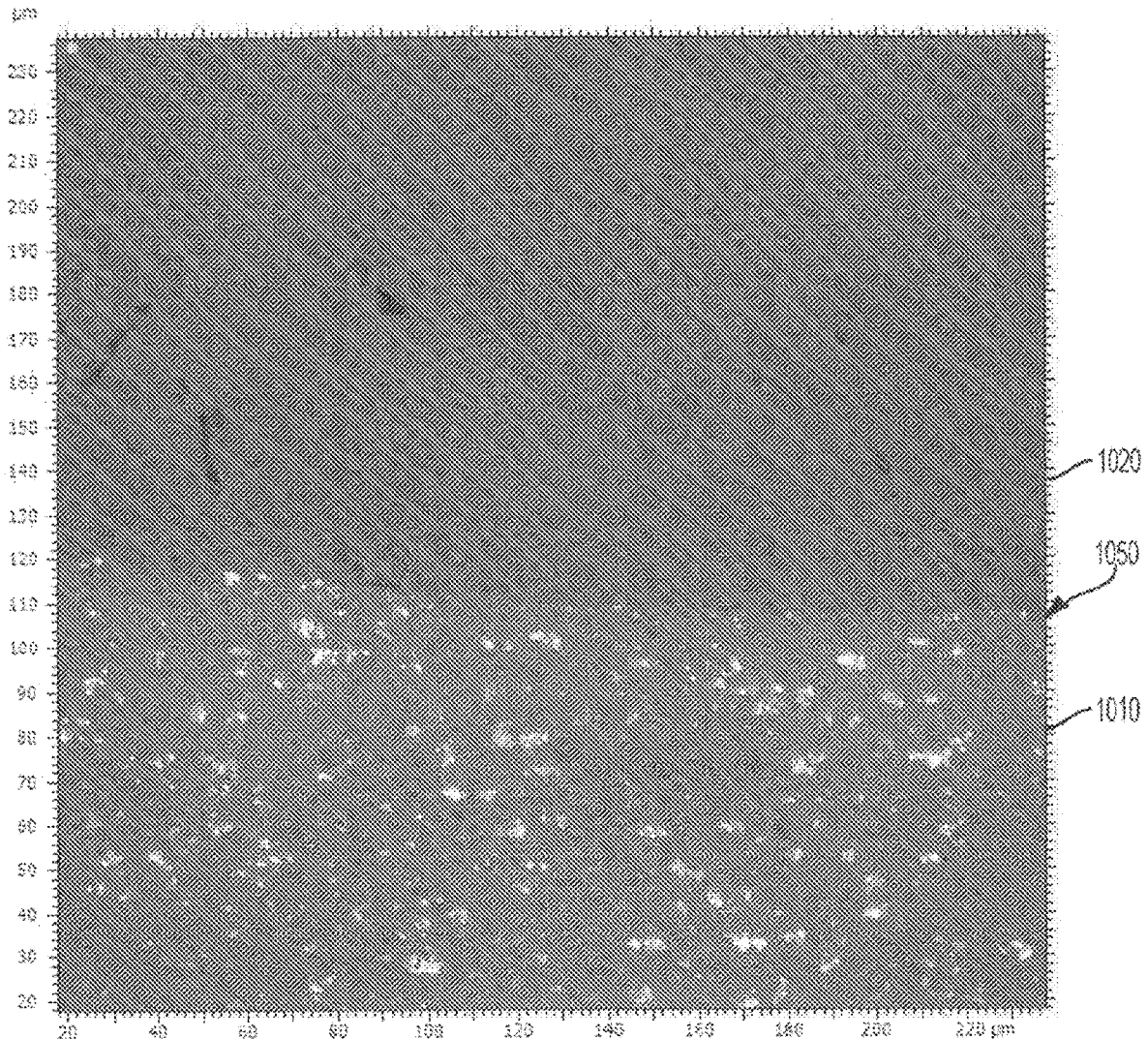
FIG. 10 is a scanning electron microscope (SEM) micrograph showing a non-porous outermost layer having an interface with a silicon nitride heater substrate free of porosity and secondary phases.

In some embodiments, a green layer of rare earth silicate may be prepared directly from rare earth silicate powders in the fabrication of the outermost layer as a corrosion protective layer for heater substrates. An example of the fabrication of the outermost layer from pre-reacted is detailed in Example 3. To provide good corrosion resistance, the interface of the sintered laminate should be essentially porosity free and show no delamination. In the cross-sectional scanning electron microscope (SEM) micrograph as in FIG. 10, a dense, adherent rare earth silicate layer 1020 on a silicon nitride heater substrate 1010 is illustrated with an interface 1050 free of porosity and secondary phases. Interface 1050 demonstrates less than about 5 volume percent porosity at the interface 1050 between the rare earth silicate layer and the silicon nitride heater substrate. Further, no delamination at the interface 1050 is indicative of good corrosion resistance.

Layer thickness for the non-porous outermost layer may be tailored to the wafer heater, the heater substrate, as well as its application for use. The non-porous outermost layer is also referred to interchangeably herein as corrosion barrier or corrosion-resistant layer. Depending on the nature of the process used to make the heater, the as-fired profile of a large component (for example, a component having a diameter between about 250 mm and about 1 m) such as a wafer heater may depart by a millimeter or more from the desired profile; therefore in such cases, it is desirable for the as-fired thickness of the outermost layer to be substantially more than one millimeter thick, in some embodiments between about 2 mm and about 5 mm thick, in order to ensure the presence of enough outermost material even after finishing of the part, i.e., grinding. Thinner layers are more appropriately used on smaller components (for example, components having a diameter of up to about 250 mm) or more tightly controlled fabrication processes, because departures from the true form are typically less.

The outermost layer thickness after densification may be between about 0.05 mm and about 15 mm, in some embodiments about 0.5 mm, about 1 mm, about 2 mm, about 4 mm, about 5 mm, about 6 mm, about 7 mm, about 8 mm, about 9 mm, about 10 mm, or about 15 mm, or within any range defined between any two of the foregoing values. In some embodiments, the thickness may be greater than 10 mm to allow for machining of channels, mesas, or grooves as needed.

The microstructure of the non-porous outermost layer is important to the durability and performance of the wafer heater. A wafer heater or laminate including a non-porous outermost layer free of microcracks and fissures does not suffer deleterious effects such as particle shedding. In some embodiments, the non-porous outermost layer is characterized by a microstructure devoid of microcracks and fissures. In embodiments of the disclosure, the non-porous outermost layer is characterized by a microstructure substantially devoid of microcracks and fissures. In embodiments of the disclosure, the total amount of microcracks and fissures in the non-porous outermost layer can be between about 0 per $mm^2$ and about 5 per $mm^2$, in some embodiments is as little as 0 per $mm^2$, 1 per $mm^2$, or 5 per $mm^2$, or as great as 10 per $mm^2$, 25 per $mm^2$, or 50 per $mm^2$, or within any range defined between any two of the foregoing values. In embodiments of the disclosure, the non-porous outermost layer is characterized by a microstructure having microcracks and fissures of at most 1 per $mm^2$, as quantified by image analysis, for example, or other methods as known in the art.

In embodiments of the disclosure, grain size of the non-porous outermost layer is important to the performance of the wafer heater. Generally, corrosion occurs fastest at grain boundaries, thus materials with larger grain sizes corrode more slowly. In addition, if corrosion on boundaries is relatively rapid, entire grains can be dislodged by grain boundary corrosion. This is also referred to herein as particle loss or shedding. In embodiments of the disclosure, the wafer heater includes a non-porous outermost layer having an average grain size as measured by ASTM-E112 of between about 100 nm and about 100 microns. In embodiments of the disclosure, the corrosion-resistant non-porous layer is characterized as having an average grain size of between about 100 nm and about 100 microns, in some embodiments about 0.1 μm (100 nm), about 1 μm, about 10 μm, about 15 μm, about 20 μm, about 25 μm, about 30 μm, about 35 μm, about 40 μm, about 45 μm, about 50 μm, about 55 μm, about 60 μm, about 65 μm, about 70 μm, about 75 μm, about 80 μm, about 85 μm, about 90 μm, about 95 μm, or about 100 μm, or within any range defined between any two of the foregoing values. In some embodiments of the disclosure, the non-porous outermost layer comprises at least about 50 volume percent ytterbium disilicate ($Yb_2Si_2O_7$) having a Keiviite crystal structure. In some embodiments, the $Yb_2Si_2O_7$ having a Keiviite crystal structure can be between about 50 volume percent and about 100 volume percent of the total volume of the outermost layer. In some embodiments, the volume percent of the $Yb_2Si_2O_7$ having a Keiviite crystal structure of the outermost layer can be about 50 vol. %, about 55 vol. %, about 60 vol. %, about 65 vol. %, about 70 vol. %, about 75 vol. %, about 80 vol. %, about 85 vol. %, about 90 vol. %, about 95 vol. %, or about 100 vol. %, or within any range defined between any two of the foregoing values. In some embodiments, some or all of the Yb in the $Yb_2Si_2O_7$ be replaced with one or more other rare earth elements while maintaining a Keiviite crystal structure. In some embodiments, the Keiviite structure can be replaced with a gamma structure using other rare earth elements in the rare earth disilicate.

In embodiments of the disclosure, the non-porous outermost layer associated with the heater substrate can be adhered to the heater substrate. In embodiments of the disclosure, the non-porous outermost layer is adhered directly to the heater substrate. In embodiments of the disclosure, the non-porous outermost layer is adhered indirectly to the heater substrate, for example with interposing layers therebetween.

The porosity of the interposing layer can be between about 0% and about 5%, in some embodiments about 0%, about 0.5%, about 1.0%, about 1.5%, about 2%, about 3%, about 4%, about 4.5%, or about 5%, or within any range defined between any two of the foregoing values based on the total volume. The porosity of the interposing layer should be sufficiently low but does not need to be as low as the porosity of the corrosion-resistant non-porous layer. This is because the interposing layer is not exposed to the processes such as plasma etching or deposition as is the corrosion-resistant non-porous layer.

It is important to choose the materials of the embedded layers to match the thermal expansion coefficient of the bulk composite as well as to the individual layer(s) of the composite as mismatches tend to lead to delayed delamination within the component. Thermal expansion mismatches can be considered close or acceptable if the difference in thermal expansion coefficients is between about $0 \times 10^{-6}$/K and about $4 \times 10^{-6}$/K relative to the coefficients for the ceramic insulating substrate and the corrosion-resistant non-porous layer. In embodiments of the disclosure, at least one interposing layer is chosen to be a material having a thermal expansion coefficient difference between about $0 \times 10^{-6}$/K and about $4 \times 10^{-6}$/K relative to the coefficients for the ceramic insulating substrate and the corrosion-resistant non-porous layer. Thermal expansion mismatches can often be helped by making the layer a composite of several different materials, whose combined thermal expansion matches the expansion of the bulk of the part.

Very low levels of carbon, for example between about 0 ppm and about 200 ppm carbon content by weight, are believed to also contribute to desirably light or white components according to the present disclosure. In embodiments of the disclosure, the carbon content can be between about 0 ppm and about 200 ppm, in some embodiments about 10 ppm, about 20 ppm, about 30 ppm, about 40 ppm, about 50 ppm, about 60 ppm, about 70 ppm, about 80 ppm, about 90 ppm, about 100 ppm, about 110 ppm, about 120 ppm, about 130 ppm, about 140 ppm, about 150 ppm, about 160 ppm, about 170 ppm, about 180 ppm, about 190 ppm, or about 200 ppm, or within any range defined between any two of the foregoing values. In another embodiment the carbon content is at most 100 ppm. In yet another embodiment the carbon content is at most 50 ppm.

Fabrication of Wafer Heater Assembly with Silicon Nitride Heater Substrate.

Figure 11:
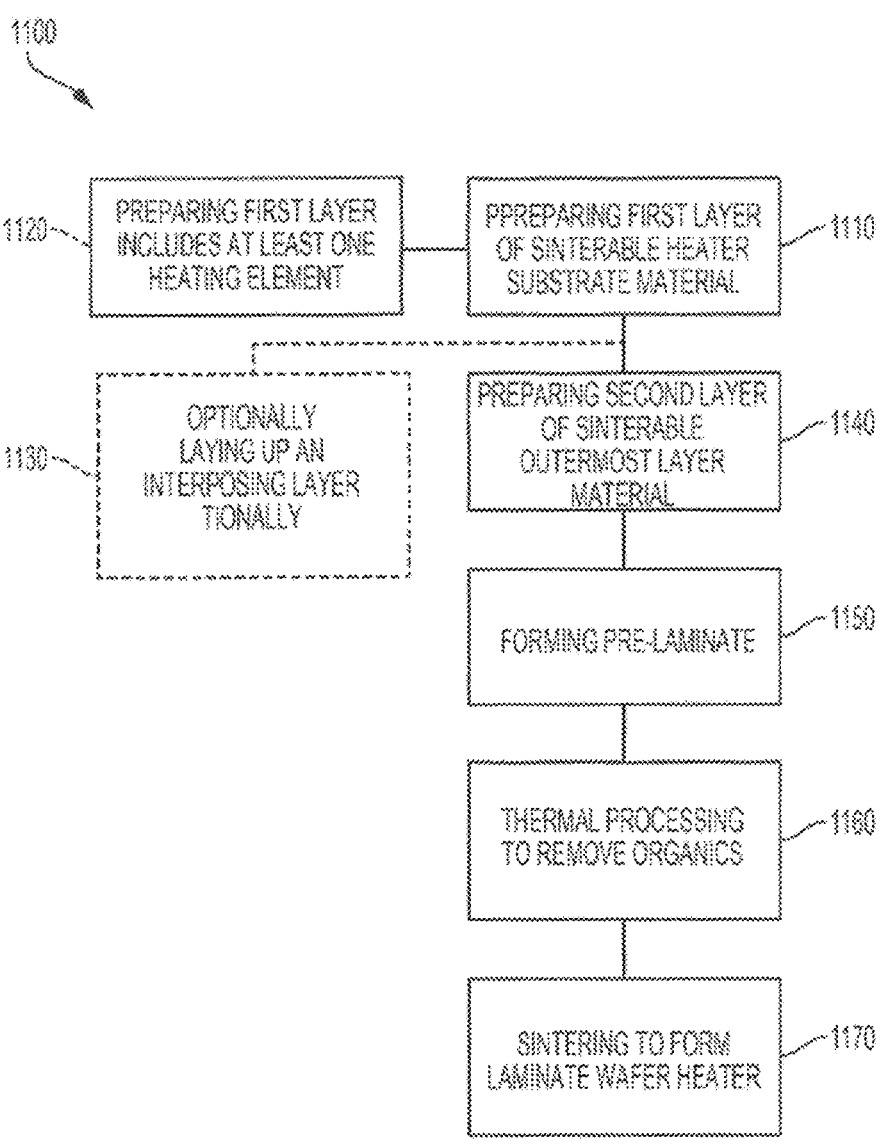
FIG. 11 is a flow chart illustrating a method of making wafer heater assemblies.

Wafer heater assemblies according to the present disclosure include a heater substrate and non-porous outermost layer and may be formed, according to the method 1100 as illustrated in FIG. 11, using ceramic processing techniques chosen from dry pressing, cold isostatic pressing, roll compaction and tape casting followed by lamination, or a combination of these methods. To prepare the first layer of sinterable heater substrate material as in step 1110, the slurry or slip comprising silicon nitride and appropriate inorganic and organic additives is either spray dried for pressing or adjusted to the correct rheology for tape casting.

The silicon nitride heater substrate may further include at least the introduction of one heating element or metal layer in step 1120. At least one metal layer may be inserted into the heater substrate in a pre-fabricated form as an appropriately shaped wire mesh, metal foil, or thick film printed on tapes prior to lamination. If thick film printing is used, the required metal inks are carefully formulated with the inorganic ingredients, i.e., Mo, W, Hf, Rh, Ti, Ta, Zr, V, alloys or compounds thereof, and combinations thereof, including compounds of the inorganic ingredients such as borides, carbides, nitrides, aluminides, and silicides and organic ingredients such as solvents and binders to yield a printable paste. The metal layer may comprise refractory metal compounds alone, refractory metals alone, or composites of refractory metal compounds, refractory metals, silicon nitride, sintering aids, other property modifying additives, and combinations thereof. Screens or stencils may then be used to print the required heating element patterns, interconnects and RF electrodes as needed. Vias are filled either by screen printing or by using an ink dispensing instrument. Step 1120 can occur at a temperature between about 20° C. and about 150° C., in some embodiments about 20° C., about 25° C., about 30° C., about 35° C., about 40° C., about 45° C., about 50° C., about 60° C., about 70° C., about 80° C., about 90° C., about 100° C., about 110° C., about 120° C., about 130° C., about 140° C., or about 150° C., or within any range defined between any two of the foregoing values.

Optionally as needed to form the pre-laminate, an interposing layer may be included according to step 1130. The interposing layer may be provided to the system by screen printing or the lamination of a green ceramic tape.

The silicon nitride heater substrate further includes an outermost layer for the corrosion barrier layered on top of the silicon nitride heater substrate body as in step 1140. This can be done by pressing a uniform layer of pre-synthesized rare earth silicate powder to achieve a known thickness after densification. Alternatively, a thin sheet of rare earth silicate material can be tape cast and laminated on top of the silicon nitride. Another option is to synthesize the rare earth silicate layer in-situ during sintering by starting with a mixture of rare earth oxide and silica having the desired molar ratio of $SiO_2:Yb_2O_3$ to form $Yb_2Si_2O_7$. Step 1140 can occur at a temperature between about 20° C. and about 15° C.

The layers according to steps 1110-1140 are disposed to form a pre-laminate as in step 1150. Any organic constituents are removed by thermal processing in step 1160 at a temperature between about 150° C. and about 650° C., in some embodiments about 150° C., about 200° C., about 250° C., about 300° C., about 350° C., about 400° C., about 450° C., about 500° C., about 550° C., about 600° C., or about 650° C., or within any range defined between any two of the foregoing values; or alternatively the organics may be removed concurrently in the sintering step 1170. Co-sintering as in step 1170 of the silicon nitride, the metal and optional layers, and the outermost layer may be accomplished in an inert atmosphere (e.g., $N_2$, argon, or helium atmosphere, or combinations thereof) at temperatures of between about 1500° C. and about 1900° C., in some embodiments about 1500° C., about 1550° C., about 1600° C., about 1700° C., about 1800° C., or about 1900° C., or within any range defined between any two of the foregoing values to densify the layers of the laminate. Step 1170 includes sintering at ambient pressure (i.e., pressureless sintering), under gas pressure (i.e., gas pressure sintering), or uniaxial pressure (i.e., hot pressing). The pressure can be between about 0 psi and about 40000 psi, in some embodiments about 0 psi, about 50 psi, about 100 psi, about 150 psi, about 250 psi, about 500 psi, about 750 psi, about 1000 psi, about 5000 psi, about 10000 psi, about 20000 psi, about 30000 psi, about 40000 psi, or within any range defined between any two of the foregoing values. Glass assisted hot isostatic pressing may also be employed for sintering to accomplish densification of the laminate wafer heater.

After densification, the wafer heater sintered body may be machined to meet dimensional requirements. Any required bonding of a shroud can now be done and electrical leads that supply power can be brazed to the heater backside using conventional brazing processes. The machined parts can be cleaned by using detergents, ultrasonics and/or high purity chemical reagents.

In embodiments of the disclosure, the total concentration of undesirable elements in raw materials used in making of the wafer heater assemblies of the present disclosure is between about 0 atomic % and about 1 atomic %, in some embodiments about 0 atomic %, about 0.1 atomic %, about 0.2 atomic %, about 0.3 atomic %, about 0.4 atomic %, about 0.5 atomic %, about 0.6 atomic %, about 0.7 atomic %, about 0.8 atomic %, about 0.9 atomic %, or about 1 atomic %, or within any range defined between any two of the foregoing values. First row transition elements such as V, Cr, Mn, Fe, Co, Ni, Cu, and Zn, for example, diffuse relatively quickly through silicon and can alter the electrical properties of devices. The presence of Au and Ag can cause similar problems. In addition, elements such as Li, Na, and K diffuse quickly through silica and can affect the charge density on device gates. The wafer heater of the present disclosure is substantially contaminant free (i.e. between about 0 atomic % and about 1 atomic % of impurities). Total concentration of undesirable elements in the raw materials for making corrosion-resistant components is to be minimized. The total concentration of these undesirable elements should be substantially less than 1 atomic %, preferably between about 0 ppm and about 5 ppm per undesirable element, in some embodiments about 0 ppm, about 0.1 ppm, about 0.2 ppm, about 0.5 ppm, about 1 ppm, about 1.5 ppm, about 2 ppm, about 2.5 ppm, about 3 ppm, about 3.5 ppm, about 4 ppm, about 4.5 ppm, about 5 ppm, or within any range defined between any two of the foregoing values.

Silicon Nitride Heater in Use

A ceramic heater assembly purchased from a supplier can be attached to the interior of a chamber, for example a vacuum chamber, and connected for use in the chamber. A user of this system can place one or more wafers on the heater, heating each wafer to a certain temperature, depositing some material on the wafer using reactive gases, and then removing the wafer and replacing it with a fresh one. After a certain number of wafers has been processed and the assembly may become intolerably dirty on the inside, at which time it can be cleaned by flooding the interior with an activated halogen-containing gas. This cleaning method can restore the interior to a pristine condition. The processing of the wafers can then be restarted. This process would continue as required by the user.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value. As used herein, the singular forms "a", "an" and "the" include plural unless the context clearly dictates otherwise.

EXAMPLES

Example 1: Silicon Nitride Heater Substrate (with CTE Modifier)

A ceramic slip, comprised of both inorganic and organic batch components milled together, was formulated and prepared to create a material that is pseudoplastic/shear thinning for tape casting. Inorganic batch components included silicon nitride powder (Ube, SN-ESP grade, surface area of 10 $m^2/g$) as 52.9 wt % of the total slip mixture and the sintering aids as approximately 12.8 wt % of the total slip mixture. Sintering aids were: silicon dioxide (US Silica, MIN-U-SIL) as approximately 2.0 wt % of the total batch formulation, ytterbium oxide (NEO Corporation) as approximately 6.7 wt % of the total batch formulation, and molybdenum disilicide (HC Starck, Grade G) as approximately 4.1 wt % of the total batch formulation. Organic batch components included a ternary solvent system of methyl ethyl ketone, toluene, and cyclohexanone, measuring approximately 17.1 weight % of the total batch formulation. Several different polymeric materials constituted the remainder of the batch formulation; these included a dispersant, Hypermer™ KD-1 (Croda), a binder, Paraloid™ B-72 (Dow Chemical), a Type I plasticizer, Santicizer® S-160 (Valtris), and a Type II plasticizer, UCON™ 50-HB 5100 (Dow Chemical). First, the solvents were added to a carboy with milling media, along with the dispersant and the sintering aids and other additive and milled for two hours. The silicon nitride powder was then added progressively over time and milled for 24 hours. After the inorganics were milled, the binder and both Type I and Type II plasticizers were added and milled along with the de-skinning agent cyclohexanone. The final steps of slip preparation involved vacuum de-aeration prior to tape casting. The above slip was then cast on a conventional tape casting machine to produce silicon nitride green tape of desired thickness of between 0.46 mm (0.018 inches) to 1.27 mm (0.050 inches) depending on the desired thickness of the targeted layer in the heater architecture. Once the tape was dry, it was cut into sheets for further processing.

Next, ink was prepared for thick film printing of metal layers for embedding into the silicon nitride. 1-Octanol (Sigma Aldrich), butyl carbitol (Sigma Aldrich, >99% pure) and ethyl cellulose (Sigma Aldrich), tungsten carbide (GTP), silicon nitride (Ube E10) and ytterbium oxide (Neo Corp.) were ultrasonically mixed in a jar for three minutes. The jar was then placed in a hot water bath maintained at 250° C. and stirred. Once the organics and inorganics were blended, the mixture was placed in an ultrasonic mixer and further processed for 8 minutes. The mixture was then slowly sent through a three-roll mill and milled for 45 minutes until an ink with paste like consistency was achieved.

Referring to FIG. 2 for reference, inks with different levels of tungsten carbide were made for the heating element layer 240, vias 275, and interconnect layers 270 to achieve different electrical resistivities. For the heating element layer and vias, an ink with 42.5 volume percent WC was prepared. The remaining volume percentage of the ink included inorganic material, such as silicon nitride and/or sintering aids, and excludes organic additives, such as solvents and/or binders. For the interconnect layer, an ink with 90 volume percent WC was prepared.

The prepared inks were screen printed on separate tape cast silicon nitride sheets and subsequently laminated to form an assembly similar to the wafer heater assembly 200 schematically represented in FIG. 2. Vias between the embedded metal layers (i.e., heating elements, interconnects) were filled with the above via ink using an ink dispensing instrument. Another tape cast sheet of silicon nitride, with vias to the backside of the heater substrate body, were filled similarly and laminated to the other laminate thus completing the green fabrication of the unsintered, heater substrate body with the metal layers embedded therein.

The laminated green heater substrate body was then subjected to a thermal de-binding step to remove the organics followed by hot pressing at 1630° C. at 20 MPa in nitrogen to form a dense silicon nitride wafer heater. Electrical leads were brazed to the vias exposed to the backside of the heater using an active braze metal and a conventional high vacuum braze furnace to form a first sample (E1S1) of a silicon nitride wafer heater assembly. A second sample (E1S2) was made according to the procedure for E1S1 above, and a cross-sectional slice through the silicon nitride body and embedded metal WC layer was prepared, polished, and examined by SEM to observe the quality of the microstructure. As the observed for the microstructure illustrated in FIG. 12 in backscatter mode at 400× magnification, the silicon nitride heater substrate 1210 was dense and free of pores with no defects at or near the interface 1250 with the metal layer 1240. Substrate 1210 comprised a mixture of fine grains of silicon nitride, molybdenum silicide, and a glass phase. The metal layers 1240, which include the heating element layer and the interconnect layer, were also dense. The interface 1250 between the heating element layer and the insulator was free of porosity and any other defects such as cracks. X-ray diffraction of the heater substrate indicated the phases present: $\alpha$-$Si_3N_4$ (53 wt %), $\beta$-$Si_3N_4$ (27 wt %), $Yb_2Si_2O_7$ (10.6 wt %), and $Mo_{4.8}Si_3C_{0.6}$ (4 wt %), SiCN (2.4 wt %), $Si_2N_2O$ (2 wt %), and $MoSi_2$ (1 wt %). X-ray diffraction of the metal layer indicated that the major phases present were: $\alpha$-$Si_3N_4$, $\beta$-$Si_3N_4$, $Yb_2Si_2O_7$, and WC.

Figure 13:
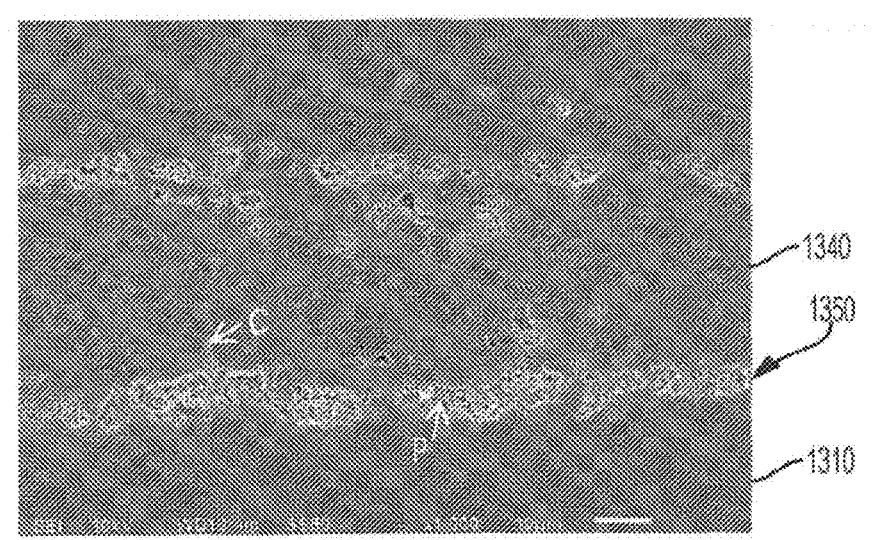
FIG. 13 is an SEM micrograph at 1000× magnification showing a metal layer embedded in a silicon nitride heater substrate, without a CTE modifier, in a comparative example.

Comparative Example C1.1: Silicon Nitride Heater Substrate Without CTE Modifier Comparative Example (C1.1) was fabricated according to Example 1, except that no molybdenum silicide as CTE modifier was added to the silicon nitride formulation in the slurry used for tape casting. Instead, the amount of silicon nitride powder was increased by 4.1 wt %. Referring to the cross-sectional microstructure as illustrated in FIG. 13 analyzed by SEM at 1000× magnification, the silicon nitride heater substrate 1310 was dense and comprised a mixture of fine grains of silicon nitride and a glass phase. The metal layers (heating element layer 1340 were also dense. However, the interface 1350 between the heating element layer 1340 and the heater substrate 1310 had a significant amount of porosity P and cracks C were also evident.

Figure 12:
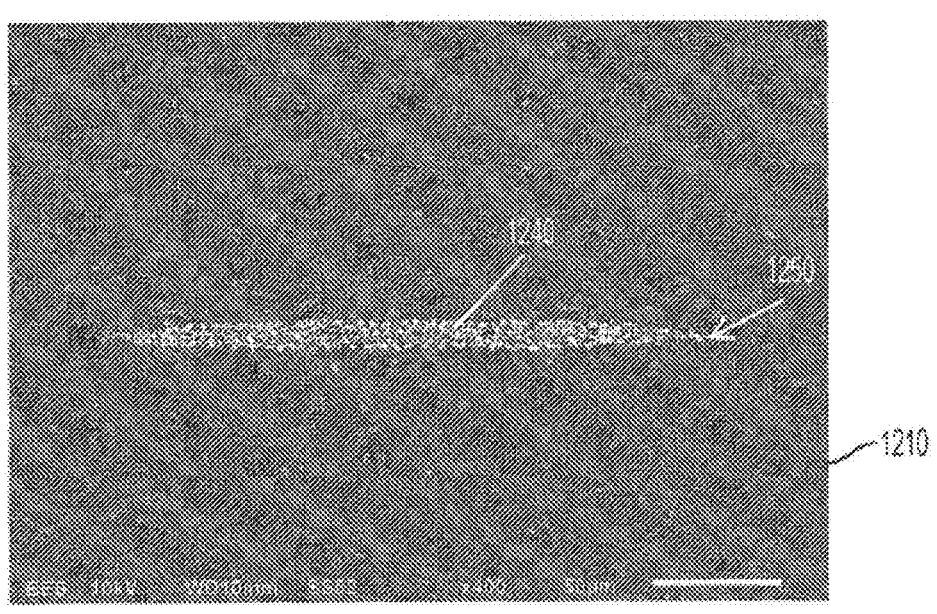
FIG. 12 is an SEM micrograph in backscatter mode at 400× magnification showing a metal layer embedded in a silicon nitride heater substrate, CTE modified.

As illustrated in FIGS. 12 and 13, the microstructures of samples E1S2 and C1.1 respectively showed the importance of including a CTE modifying additive such as molybdenum silicide (as in sample E1S2) in the heater substrate body formulation prevents pores, cracks, and other defects that contribute to deleterious effects such as delamination and/or premature failure of the wafer heater in service.

Example 2: Silicon Nitride Heater Substrate with a Target Corrosion Barrier Layer $SiO_2$:$Yb_2O_3$ Molar Ratio of 2.4

Example 2 (E2) was fabricated according to Example 1 with the addition of a corrosion barrier layer on the outermost layer of the heater substrate. The corrosion barrier layer for forming a non-porous outermost layer was targeted as a single-phase ytterbium disilicate to be formed in-situ during densification, which included co-sintering with the heater substrate. Starting with oxides, powders of ytterbia and silica were used to fabricate the green outermost layer to form yttrium disilicate upon sintering.

A ceramic slip for tape casting for the outermost layer, comprised of both inorganic and organic batch components, were formulate and milled together to create a material that was pseudoplastic/shear thinning for tape casting. Organic bath components included a ternary solvent system that was about 13 wt % of the total batch formulation: methyl ethyl ketone, toluene and cyclohexanone; and several different polymeric materials that constituted about 8 wt % of the total batch formulation. Polymeric constituents included a dispersant, Hypermer™ KD-1 (Croda); a binder, Elvacite® 2010 (Lucite International); a Type I plasticizer, Santicizer® S-160 (Valtris); and a Type II plasticizer, UCON™ 50-HB 5100 (Dow Chemical). Inorganic batch components included $Yb_2O_3$ powder (NEO Corporation) and $SiO_2$ powder (Admatechs Admafine FE925 grade, amorphous). For E2, the $SiO_2$:$Yb_2O_3$ molar ratio was 2.4, corresponding to 70.5 mole % $SiO_2$ and 29.5 mole % $Yb_2O_3$. A higher than expected $SiO_2$ mole % (referring to the $Yb_2O_3$—$SiO_2$ phase diagram) was required for the starting slip to account for $SiO_2$ loss due to reaction with carbon downstream in the manufacturing process.

The final steps of slip preparation involved vacuum de-aeration prior to tape casting. The above slip was then cast on a conventional tape casting machine to produce silica/ytterbia green tape of desired thickness of about 0.46 mm (0.018 inches). Once the tape was dry, it was cut into sheets for further processing.

The above tape with $SiO_2$:$Yb_2O_3$ molar ratio of 2.4 was then laminated to the top surface of the heater substrate body prepared according to Example 1 to complete the green fabrication of the pre-laminate. As in Example 1, the green pre-laminate of E2 was hot pressed and subsequently electrical leads were brazed to the exposed vias on the backside of the heater substrate.

After densification, the wafer heater sintered laminate according to Example 2 was cross-sectioned to examine phases present and microstructure. X-ray diffraction (XRD) confirmed that the only phase present in the non-porous outermost layer was $Yb_2Si_2O_7$. The non-porous outermost layer was well adhered to the silicon nitride heater substrate, and the interface between the non-porous outermost layer and the silicon nitride heater substrate was free of pores and defects such as cracks.

Comparative Example C2.1: Silicon Nitride Heater Substrate with Corrosion Barrier Layer $SiO_2$: $Yb_2O_3$ Molar Ratio of <2.0—"$SiO_2$-Lean"

Comparative Example (C2.1) was fabricated as in Example 2, except that the ceramic slip for fabricating the corrosion barrier layer had a $SiO_2$:$Yb_2O_3$ molar ratio of 1.6. Examination of cross-sections were completed after wafer heater fabrication and sintering. XRD confirmed the phases $Yb_2SiO_5$ and $Yb_2O_3$ were present in the outermost layer. While corrosion barrier layer of C2.1 appeared to be well bonded to the underlying silicon nitride heater substrate, the outermost layer demonstrated a microstructure having numerous cracks at the grain boundaries. Without being bound by theory, such defects were likely present due to a mismatch of CTE and/or shrinkage behavior between the different phases present in the outermost layer.

Comparative Example C2.2: Silicon Nitride Heater Substrate with Corrosion Barrier Layer $SiO_2$:$Yb_2O_3$ Molar Ratio Molar Ratio of >2.7—"$SiO_2$-Rich"

Comparative Example (C2.2) was fabricated as in Example 2, except that the ceramic slip for fabricating the outermost layer had a $SiO_2$:$Yb_2O_3$ molar ratio of 3.0. XRD confirmed phases $Yb_2Si_2O_7$ and $SiO_2$ were present in the outermost layer indicating the formulation was silica rich. While corrosion barrier layer of C2.2 appeared to be well bonded to the underlying silicon nitride heater substrate, the outermost layer exhibited a microstructure having numerous pores and inclusions of $SiO_2$.

E2, C2.1, and C2.2 demonstrate the importance of controlling the $SiO_2$:$Yb_2O_3$ molar ratio to tailor the microstructure and phases present in the outermost layer to provide for a protective, corrosion barrier layer. Other $SiO_2$:$Yb_2O_3$ composition ranges were prepared. At least 95% phase purity (i.e., of the desired $Yb_2Si_2O_7$ phase) was achieved with batch formulations having a $SiO_2$:$Yb_2O_3$ molar ratio from about 1.8 $SiO_2$:$Yb_2O_3$ to about 3.0 $SiO_2$:$Yb_2O_3$.

Example 3: Silicon Nitride Heater Substrate with Corrosion Barrier Layer Prepared from Pre-Reacted $Yb_2Si_2O_7$ Powder Example 3 (E3) was fabricated as in Example 2, except that the ceramic slip for fabricating the outermost layer included pre-reacted ytterbium disilicate ($Yb_2Si_2O_7$) powder. Ytterbium disilicate powder (Trans-Tech Ceramics and Advanced Materials, Adamstown, MD, USA) with a $d_{50}$ of 1.2 μm and a surface area of 4.2 $m^2/g$ was layered onto a silicon nitride heater substrate and hot pressed at 1630° C. at 20 MPa in nitrogen.

Figure 15:
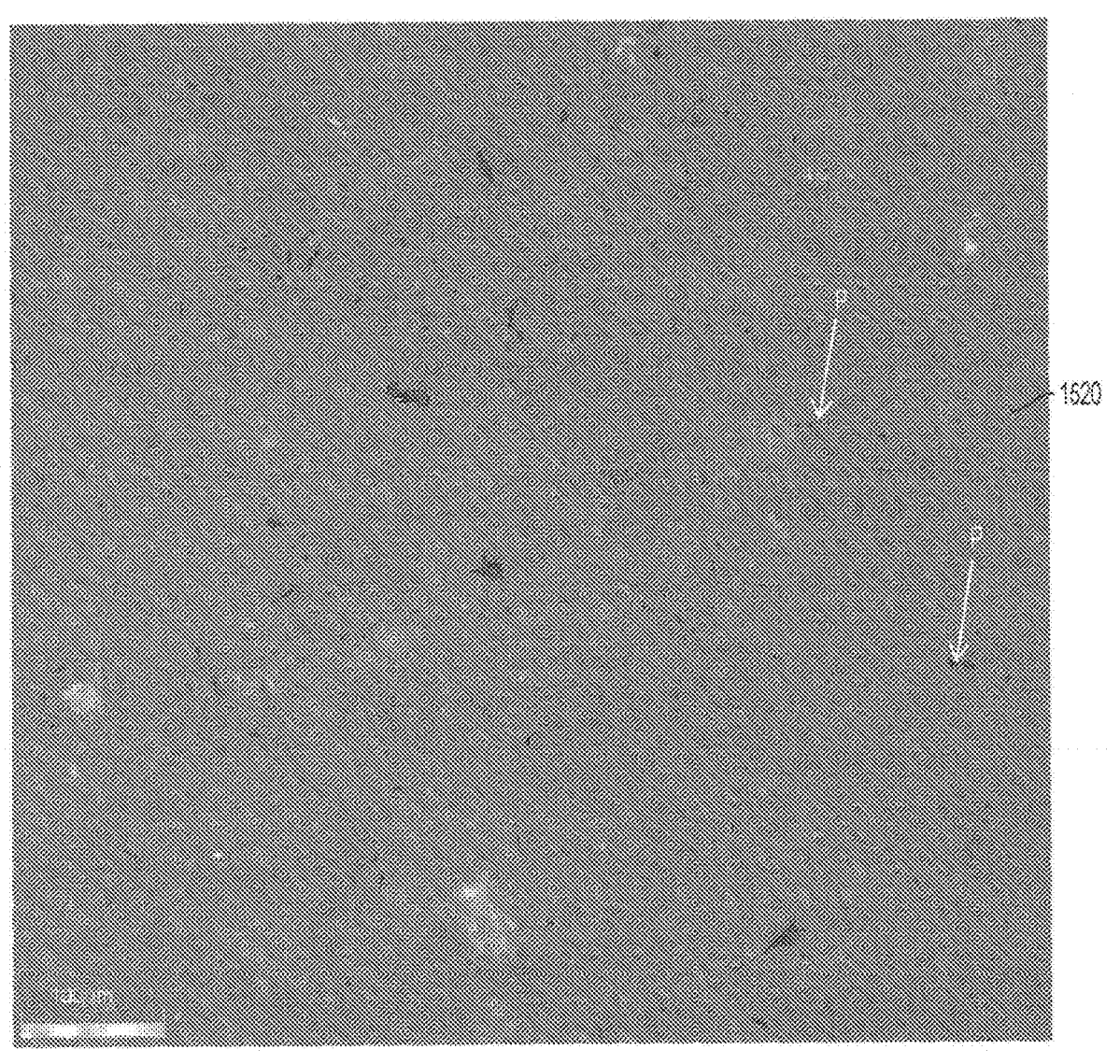
FIG. 15 is an optical bright field image of a polished section of the non-porous outermost layer as illustrated in FIG. 14.

A cross-sectional sample for analysis was prepared from E3. The non-porous outermost layer was measured to have a thickness of 1.3 mm, and the silicon nitride heater substrate was measured to have a thickness of 5.4 mm. The average grain size of the silicon nitride heater substrate was 0.38 μm, and the average grain size of the non-porous outermost layer An optical bright field image of a polished section of the outermost layer of E3 is illustrated in FIG. 15 including the non-porous outermost layer 1520 and pores P, the pores represented by the dark phase. As estimated by image analysis using a plurality of micrographs of E3, the porosity was calculated to be less than 3 volume percent.

Figure 16:
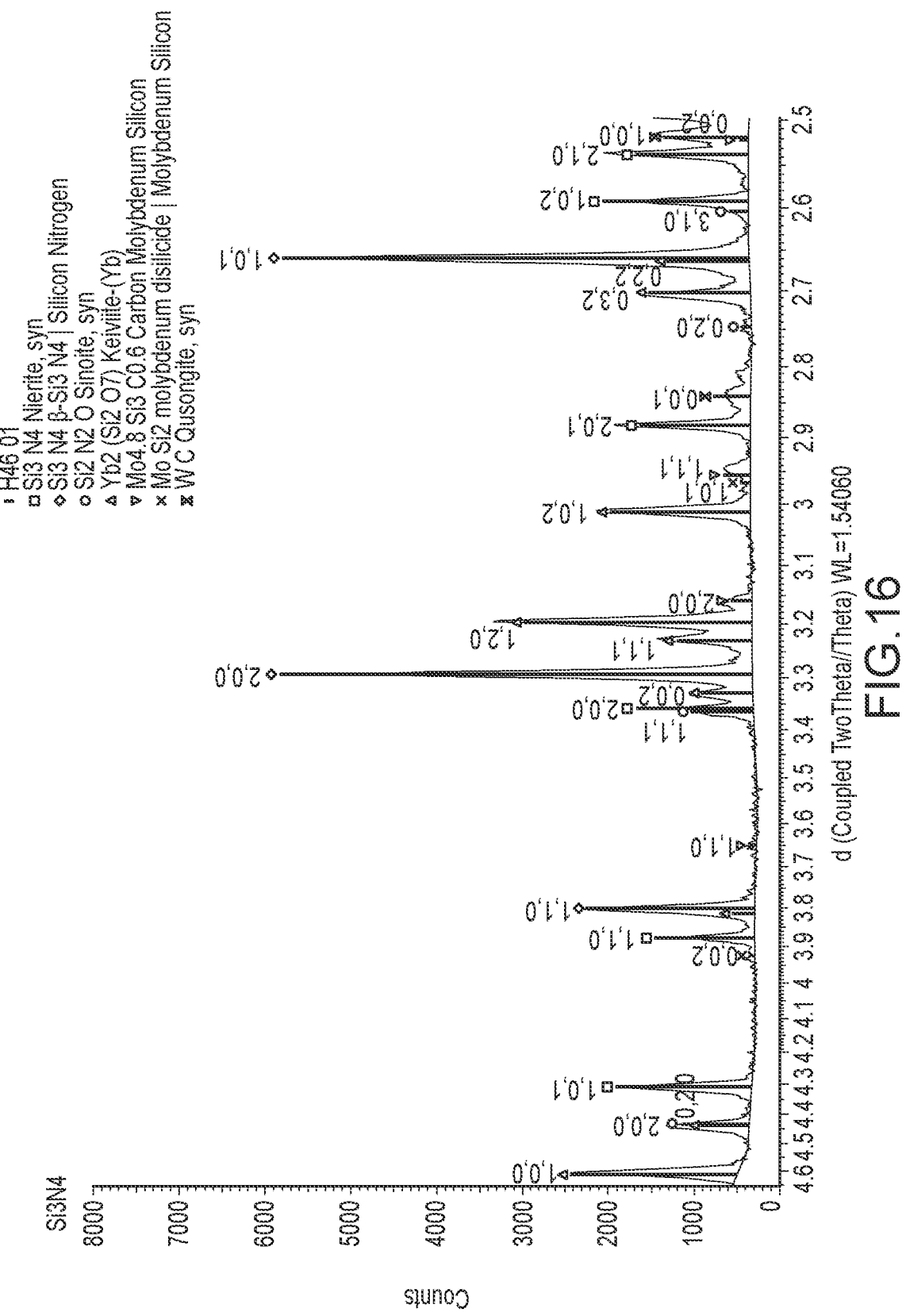
FIG. 16 is an X-ray diffraction (XRD) spectrum identifying phases present for the example illustrated in FIG. 14.

A sample of E3 was ground into powder form for phase analysis using X-ray diffraction [D8 Discover Theta-Theta X-Ray Diffractometer, copper tube operated at 40 kV, Bruker AXS GmbH, Germany], the spectrum of which is illustrated in FIG. 16. For the heater substrate phases present, Rietveld analysis calculated that the silicon nitride phases present included 35% alpha silicon nitride (α-Si3N4) and 65% beta silicon nitride (β-Si3N4). The maximum 101 peak intensity associated with the beta silicon nitride phase was more than the maximum intensity of the nearby 200 peak, indicating randomly oriented grains. For the outermost layer phases present, the only ytterbium-containing phase detectable using X-ray diffraction exhibited the Keiviite structure with the intensity of the 001 peak greater than the intensity of the neighboring 020 peak, again indicating randomly oriented grains. It should also be clear to those skilled in the art that the peaks from X-ray diffraction data and therefor the relative percentage differences may change based on differences in the X-ray diffraction parameters. In other words, different procedures may provide different results. The X-ray diffraction parameters should chosen carefully to provide results to provide results that are comparable.

Tables 1A-1B summarize the data for compositions having different $SiO_2$:$Yb_2O_3$ molar ratio formulations for Examples 1-3, E1S2, E2, E3, as well as for comparative samples C1.1, C2.1, and C2.2. All values are approximate.

TABLE 1A

| Ex. | Mole % $SiO_2$ | Mole % $Yb_2O_3$ | Molar Ratio $SiO_2$:$Yb_2O_3$ | $MoSi_2$ |
|---|---|---|---|---|
| E1S2 | NA | NA | NA | Yes |
| C1.1 | | | | No |
| E2 | 70.5 | 29.5 | 2.4 | Yes |
| C2.1 | | | 1.6 | Yes |
| C2.2 | | | 3.0 | Yes |
| E3 | | | 2.0 | Yes |

TABLE 1B

| | Defects Present | | | | Phases Present in Outermost Layer | | | |
| | Heater Substrate | | Outermost Layer | | | | | |
| Ex. | Cracks | Pores | Cracks | Pores | $Yb_2O_3$ | $Yb_2SiO_5$ | $Yb_2Si_2O_7$ | $SiO_2$ |
|---|---|---|---|---|---|---|---|---|
| E1S2 | No | No | NA | NA | NA | NA | NA | NA |
| C1.1 | Yes | Yes | NA | NA | NA | NA | NA | NA |
| E2 | No | No | No | <5% | No | No | Yes | No |
| C2.1 | No | No | Yes | No | Yes | Yes | No | No |
| C2.2 | No | No | No | Yes | No | No | Yes | Yes |
| E3 | No | No | No | <5% | No | No | Yes | No | was 34.0 μm. Average grain size measurements were obtained according to the ASTM E112-96 method.

Figure 14:
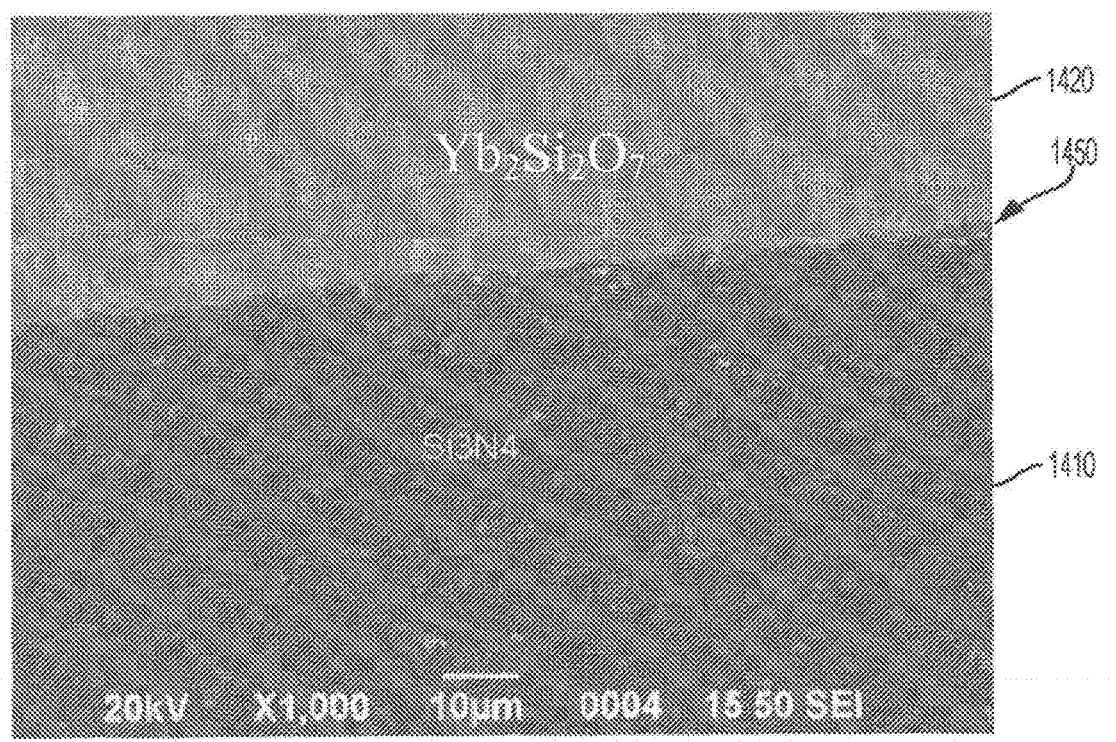
FIG. 14 is an SEM micrograph at 1000× magnification showing a non-porous outermost layer having a $SiO_2$:$Yb_2O_3$ molar ratio of 2.0 on a silicon nitride heater substrate.

Referring to the cross-sectional microstructure as illustrated in FIG. 14 for E3, the silicon nitride heater substrate 1410 was dense as was the non-porous outermost layer 1420. The interface 1450 between the outermost layer 1420 and the heater substrate 1410 demonstrated less than 5% porosity imaged at 1000× by SEM.

Figure 17:
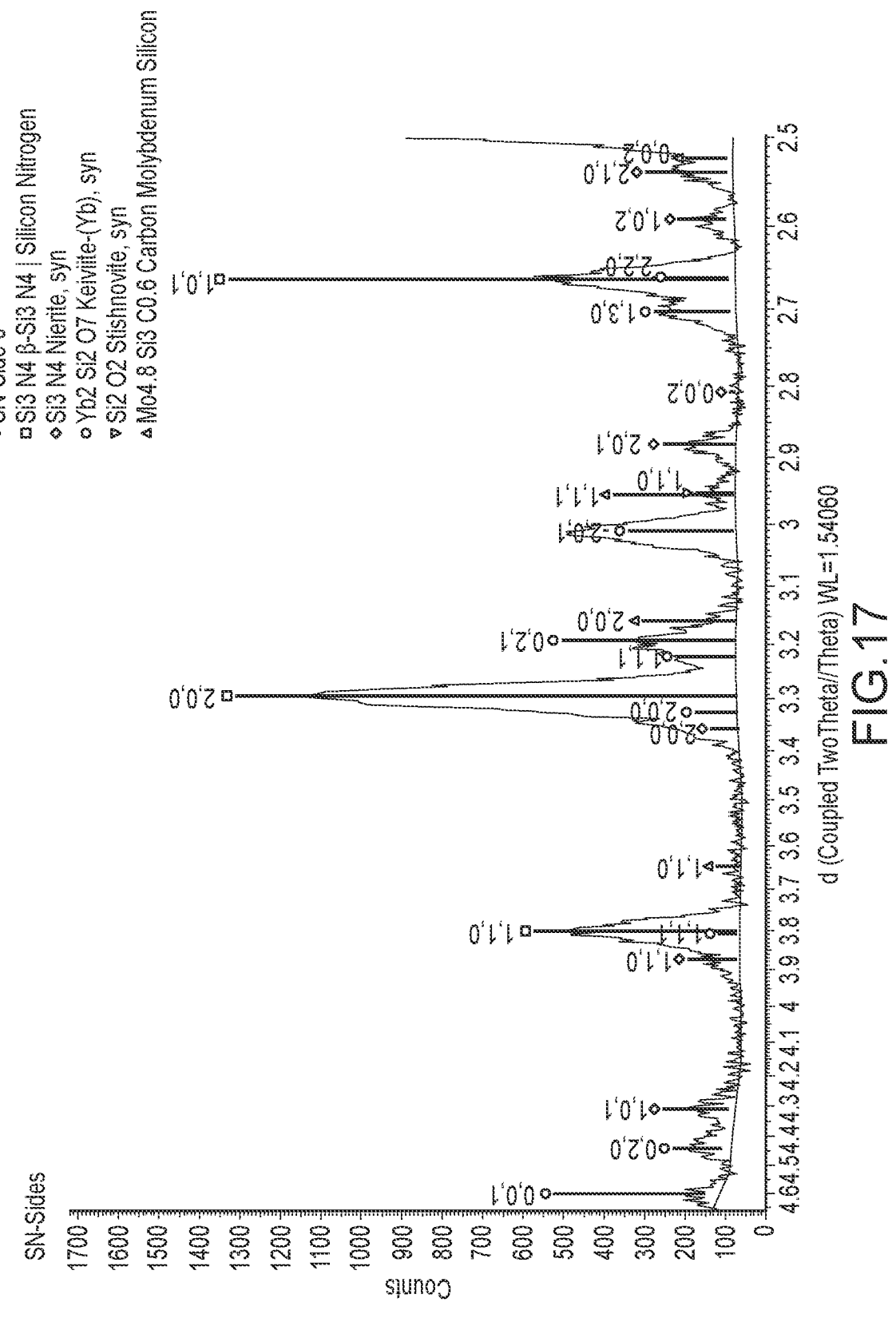
FIG. 17 is an XRD spectrum identifying phases present in the heater substrate layer for the example illustrated in FIG. 14.

Another X-ray diffraction spectrum for E3 is illustrated in FIG. 17, the sample preparation for which included grinding the surface parallel to the plane of metallization to analyze the phases present in the underlying heater substrate layer (using equipment and analysis parameters the same as for spectrum in FIG. 16). As illustrated in FIG. 17 indexing peaks for the beta silicon nitride (β-$Si_3N_4$) phase, the 101 peak intensity was less than 80% of the peak intensity of the 200 reflection indicating the c-axis of the grains lie preferentially parallel to the plane of metallization. Such preferential grain orientation is likely to lead to an increase the tensile strength of the material in this plane, thereby providing a more robust wafer heater.

Figure 18:
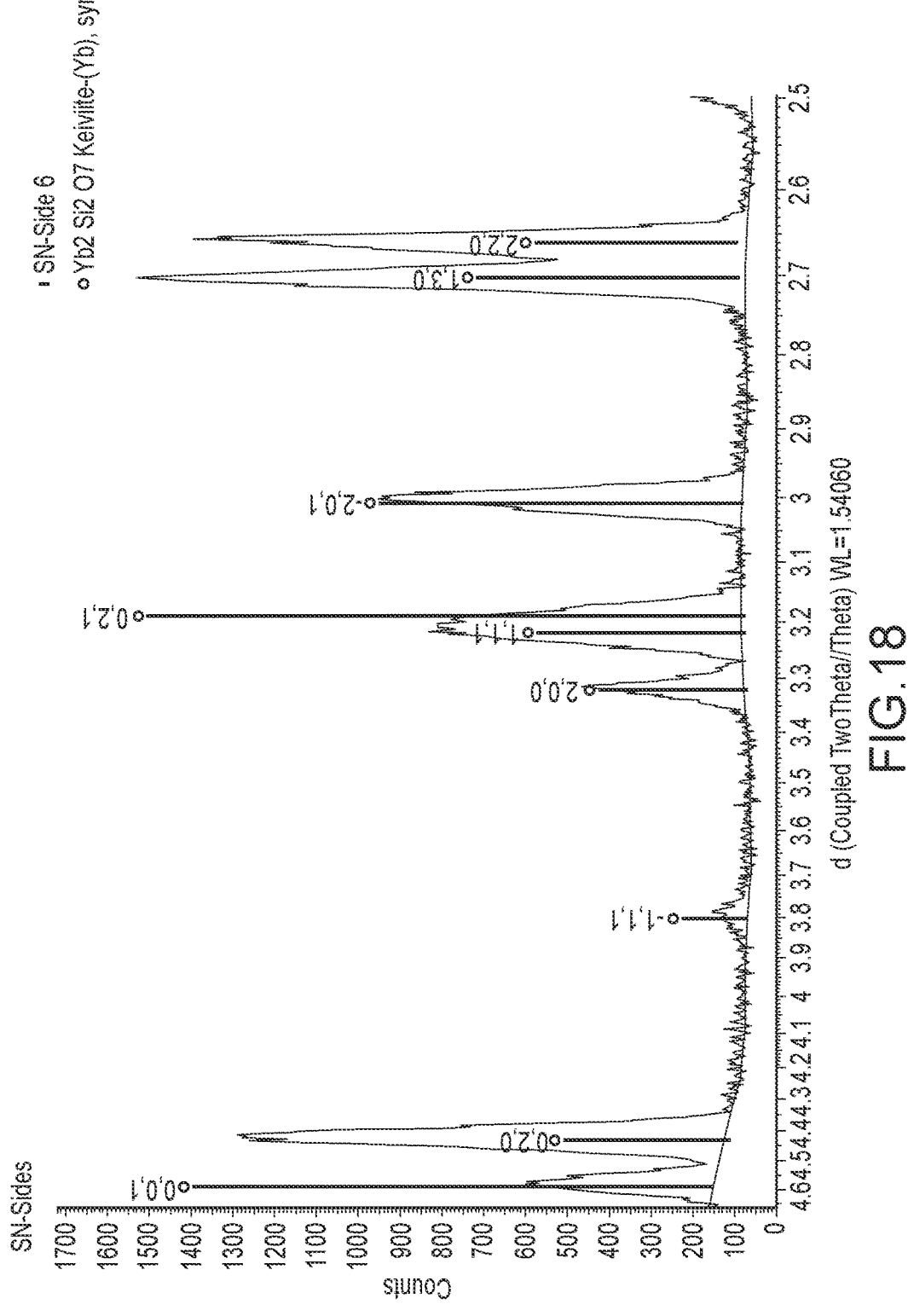
FIG. 18 is an XRD spectrum identifying phases present in the non-porous outermost layer for the example illustrated in FIG. 14.

Another X-ray diffraction spectrum for E3 is illustrated in FIG. 18. As for the sample of FIG. 16, this sample preparation included grinding the surface parallel to the plane of metallization to analyze the phases present in the outermost layer (using equipment and analysis parameters the same as for spectrum in FIGS. 16 and 17). As illustrated in FIG. 18 indexing peaks for the ytterbium disilicate ($Yb_2Si_2O_7$) phase present in the outermost layer, the 001 peak intensity was less than 70% of the peak intensity of the 020 reflection; again, this is a result indicative that the c-axis of the grains lie parallel to the plane of metallization. The thermal expansion parallel to the c-axis of the Keiviite structure in $Yb_2Si_2O_7$ is the least of the three directions. Consequently, such preferential grain orientation is indicative of reduced expansion mismatch between the $Yb_2Si_2O_7$ layer and the underlying beta silicon nitride material, which also contributes to the robustness of the heater.

Example 4: Etch Testing of Reference $Si_3N_4$ and AlN & Substrates Having Outermost Layers of $Yb_2Si_2O_7$ A $Yb_2Si_2O_7$ powder based outermost layer on a silicon nitride heater substrate was hot pressed as for Example 2 to form a 28.6 mm (1.125 inches) diameter puck. A cross-section of this sample E5 was polished and placed in a plasma etch reactor along with reference samples for comparison, a polished AlN and a polished $Si_3N_4$ sample, with appropriate etch masks in place.

The etcher was run for 9 hours at about 500 Watt microwave power and with 260 V RF bias (from a 13.56 MHz generator) using CF4 gas at 200 mTorr. The etch rate was measured from step heights, as illustrated in Table 2, and the results showed the etch rate to be about 50 nm/hr for the outermost layer ytterbium disilicate, 175 nm/hr for the AlN, and more than 4000 nm/hr for a silicon nitride reference. These results show that E5, having an outmost layer of ytterbium disilicate over a silicon nitride heater substrate, exhibited three to four times greater etch resistance than do conventional AlN heater substrates and are vastly superior to silicon nitride.

TABLE 2

| Example | Etch Rate (nm/hr) |
| --- | --- |
| E5 with $Yb_2Si_2O_7$ Outermost Layer | 50 |
| AlN Reference | 175 |
| $Si_3N_4$ Reference | 4000 |

Other Embodiments

A number of variations and modifications of the disclosure can be used. It would be possible to provide for some features of the disclosure without providing others.

The present disclosure, in various aspects, embodiments, and configurations, includes components, methods, processes, systems and/or apparatus substantially as depicted and described herein, including various aspects, embodiments, configurations, subcombinations, and subsets thereof. Those of skill in the art will understand how to make and use the various aspects, aspects, embodiments, and configurations, after understanding the present disclosure.

The present disclosure, in various aspects, embodiments, and configurations, includes providing devices and processes in the absence of items not depicted and/or described herein or in various aspects, embodiments, and configurations hereof, including in the absence of such items as may have been used in previous devices or processes, for example, for improving performance, achieving ease and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more, aspects, embodiments, and configurations for the purpose of streamlining the disclosure. The features of the aspects, embodiments, and configurations of the disclosure may be combined in alternate aspects, embodiments, and configurations other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed aspects, embodiments, and configurations. Thus, the following claims are hereby incorporated into this Detailed Description, with each claim standing on its own as a separate preferred embodiment of the disclosure.

Moreover, though the description of the disclosure has included description of one or more aspects, embodiments, or configurations and certain variations and modifications, other variations, combinations, and modifications are within the scope of the disclosure, for example, as may be within the skill and knowledge of those in the art, after understanding the present disclosure. It is intended to obtain rights which include alternative aspects, embodiments, and configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

From the above description, one skilled in the art can easily ascertain the essential characteristics of the present disclosure, and without departing from the spirit and scope thereof, can make various changes and modifications of the disclosure to adapt it to various usages and conditions. Thus, other embodiments are also considered to be within the scope of the present claims.

Ranges have been discussed and used within the forgoing description. One skilled in the art would understand that any sub-range within the stated range would be suitable, as would any number within the broad range, without deviating from the invention.

What is claimed is:

1. A wafer heater assembly, the assembly comprising:
  a heater substrate comprising nitride including at least one heating element embedded therein, the heater substrate having a first surface; and
  a non-porous outermost layer proximal the first surface of the heater substrate, the non-porous outermost layer comprising a rare earth disilicate, wherein the rare earth disilicate comprises ytterbium disilicate ($Yb_2Si_2O_7$);
    wherein the non-porous outermost layer comprises an exposed surface and a second surface, wherein the exposed surface is configured to contact a wafer for heating, and wherein the second surface faces the first surface of the heater substrate; and wherein the non-porous outermost layer realizes a Keiviite 001 peak intensity and a Keiviite 020 peak intensity, wherein the Keiviite 001 peak intensity is less than 95% of the Keiviite 020 intensity when tested using a theta-theta x-ray diffractometer, copper tube operated at 40 kV; and wherein the wafer heater assembly is configured for use in fabricating semiconductor chips and for in-situ cleaning with halogen gases.

2. The wafer heater assembly of claim 1, wherein the non-porous outermost layer and the heater substrate further include an interface therebetween, and wherein the interface comprises between about 0 volume percent and at most about 5 volume percent porosity.

3. The wafer heater assembly of claim 2, wherein the interface comprises between about 0 volume percent and at most 1 volume percent porosity.

4. The wafer heater assembly of claim 1, wherein at least a portion of the rare earth disilicate comprises a Keiviite crystal structure and wherein the non-porous outermost layer comprises between about 50 volume percent and about 100 volume percent of the rare earth disilicate having the Keiviite crystal structure.

5. The wafer heater assembly of claim 4, wherein the non-porous outermost layer comprises between about 95 volume percent and about 100 volume percent of the rare earth disilicate having the Keiviite crystal structure.

6. The wafer heater assembly of claim 1, further comprising a supporting disk configured to support the heater substrate.

7. The wafer heater assembly of claim 1, wherein the at least one heating element embedded in the heater substrate includes a first heating element and a second heating element, the first heating element associated with a first heating zone and the second heating element associated with a second heating zone, and wherein a material of the at least one heating element is selected from the group consisting of molybdenum, niobium, rhenium, tantalum, tungsten, and alloys thereof, and wherein a distance between the first heating element and the second heating element is between about 0.05 cm and about 1 cm.

8. The wafer heater assembly of claim 1, wherein the non-porous outermost layer is adjacent the first surface of the heater substrate.

9. The wafer heater assembly of claim 1, wherein the assembly comprises an interposing layer, and wherein the interposing layer is disposed between the non-porous outermost layer and the heater substrate.

10. The wafer heater assembly of claim 1, wherein the nitride of the heater substrate is selected from the group consisting of silicon nitride, aluminum nitride, and combinations thereof.

11. The wafer heater assembly of claim 1, wherein the nitride of the heater substrate comprises silicon nitride.

12. The wafer heater assembly of claim 11, wherein the heater substrate comprises at least 10 volume percent beta silicon nitride ($\text{ß-Si}_3\text{N}_4$).

13. The wafer heater assembly of claim 12, wherein an x-ray diffraction spectrum of the heater substrate comprises a beta silicon nitride $\text{ß-Si}_3\text{N}_4$ 101 peak intensity which is less than about 95% of a beta silicon nitride $\text{ß-Si}_3\text{N}_4$ 200 reflection-peak intensity when tested using a theta-theta x-ray diffractometer, copper tube operated at 40 kV.

14. The wafer heater assembly of claim 12, wherein the heater substrate comprises at least 50 volume percent beta silicon nitride ($\text{ß-Si}_3\text{N}_4$).

15. The wafer heater assembly of claim 12, wherein the heater substrate comprises at least 90 volume percent beta silicon nitride ($\text{ß-Si}_3\text{N}_4$).

16. A wafer heater assembly, the assembly comprising:

a heater substrate comprising silicon nitride ($\text{Si}_3\text{N}_4$), the heater substrate including at least one heating element embedded therein, the heater substrate having a first surface; and a non-porous outermost layer proximal the first surface of the heater substrate, the non-porous outermost layer consisting essentially of ytterbium disilicate ($\text{Yb}_2\text{Si}_2\text{O}_7$);

wherein the non-porous outermost layer realizes a Keiviite 001 peak intensity and a Keiviite 020 peak intensity, wherein the Keiviite 001 peak intensity is less than 95% of the Keiviite 020 intensity when tested using a theta-theta x-ray diffractometer, copper tube operated at 40 kV:

wherein the non-porous outermost layer comprises an exposed surface and a second surface, wherein the exposed surface is configured to contact a wafer for heating, and wherein the second surface faces the first surface of the heater substrate;

wherein the wafer heater assembly is configured for use in fabricating semiconductor chips and for in-situ cleaning with halogen gases.

17. The wafer heater assembly of claim 16, wherein the non-porous outermost layer is adjacent the first surface of the heater substrate.

18. The wafer heater assembly of claim 16, wherein the assembly comprises an interposing layer, wherein the interposing layer is disposed between the non-porous outermost layer and the heater substrate.

19. The wafer heater assembly of claim 16, wherein the non-porous outermost layer and the heater substrate further include an interface therebetween, and wherein the interface comprises not greater than 1 volume percent porosity.

* * * * *